(12) United States Patent
Sekiguchi et al.

(10) Patent No.: US 8,841,550 B2
(45) Date of Patent: Sep. 23, 2014

(54) PHOTOELECTRIC ELEMENT

(75) Inventors: Takashi Sekiguchi, Suita (JP); Mitsuo Yaguchi, Obaraki (JP); Takeyuki Yamaki, Nara (JP); Hiroyuki Nishide, Nakano-ku (JP); Kenichi Oyaizu, Suginami-ku (JP); Fumiaki Kato, Nakano-ku (JP); Michio Suzuka, Shijonawate (JP); Shingo Kambe, Hirakata (JP); Satoko Kambe, legal representative, Hirakata (JP)

(73) Assignees: Panasonic Corporation, Osaka (JP); Waseda University, Tokyo (JP)

( * ) Notice: Subject to any disclaimer, the term of this patent is extended or adjusted under 35 U.S.C. 154(b) by 357 days.

(21) Appl. No.: 13/379,114
(22) PCT Filed: Jun. 16, 2010
(86) PCT No.: PCT/JP2010/060245

§ 371 (c)(1),
(2), (4) Date: Dec. 19, 2011

(87) PCT Pub. No.: WO2010/147162

PCT Pub. Date: Dec. 23, 2010

(65) Prior Publication Data

US 2012/0119193 A1 May 17, 2012

(30) Foreign Application Priority Data

Jun. 19, 2009 (JP) ................. 2009-147070
Jul. 31, 2009 (JP) ................. 2009-180174
Oct. 27, 2009 (JP) ................. 2009-246797
Feb. 5, 2010 (JP) ................. 2010-024413

(51) Int. Cl.
| H01L 51/54 | (2006.01) |
| H01G 9/20 | (2006.01) |
| H01M 14/00 | (2006.01) |
| H01L 51/00 | (2006.01) |

(52) U.S. Cl.
CPC ........... *H01L 51/004* (2013.01); *H01L 51/0035* (2013.01); *H01G 9/2004* (2013.01); *H01G 9/2059* (2013.01); *H01G 9/2027* (2013.01); *H01L 51/005* (2013.01); *H01M 14/005* (2013.01); *Y02E 10/542* (2013.01)
USPC .............. 136/263; 136/252; 438/82

(58) Field of Classification Search
USPC ...................... 136/263, 252; 438/82
See application file for complete search history.

(56) References Cited

U.S. PATENT DOCUMENTS

| 4,082,723 A | 4/1978 | Mayer et al. |
| 5,683,832 A | 11/1997 | Bonhote et al. |

(Continued)

FOREIGN PATENT DOCUMENTS

| CN | 101297436 A | 10/2008 |
| EP | 0718288 A1 | 6/1996 |

(Continued)

OTHER PUBLICATIONS

P. Peumans, Appl. Phy. Lett., No. 79, 2001, p. 126.

(Continued)

*Primary Examiner* — Golam Mowla
(74) *Attorney, Agent, or Firm* — McDermott Will & Emery LLP

(57) ABSTRACT

A photoelectric element provided with an electron transport layer having excellent electron transport property and sufficiently wide reaction interface, and that has excellent conversion efficiency.
The photoelectric element has an electron transport layer 3 and a hole transport layer 4 sandwiched between a pair of electrodes 2 and 5. The electron transport layer 3 is formed of an organic compound having a redox moiety capable of being oxidized and reduced repeatedly. The organic compound contains an electrolyte solution which stabilizes the reduced state of the redox moiety, and forms a gel layer 6 containing a sensitizing dye. Thus, the organic compound and the electrolyte solution in the electron transport layer 3 constitute the gel layer 6, while at the same time, the sensitizing dye is present within the gel layer 6, whereby the reaction interface of the organic compound is enlarged, improving the conversion efficiency and the electron hand-over efficiency from the sensitizing dye to the organic compound in the electron transport layer 3, as a result of which the electron transport efficiency is improved.

15 Claims, 5 Drawing Sheets

(56) References Cited

U.S. PATENT DOCUMENTS

| | | | |
|---|---|---|---|
| 5,728,487 | A | 3/1998 | Gratzel et al. |
| 8,013,241 | B2 | 9/2011 | Koumura et al. |
| 2003/0062080 | A1 | 4/2003 | Satoh et al. |
| 2005/0263183 | A1* | 12/2005 | Nishikitani et al. .......... 136/263 |
| 2008/0041438 | A1 | 2/2008 | Saito et al. |
| 2009/0266419 | A1 | 10/2009 | Koumura et al. |

FOREIGN PATENT DOCUMENTS

| | | |
|---|---|---|
| JP | 07-288142 A | 10/1995 |
| JP | 2003-100360 A | 4/2003 |
| JP | 2006-073900 A | 3/2006 |
| JP | 2006-210102 A | 8/2006 |
| JP | 2008-016442 A | 1/2008 |
| WO | 95/18456 A1 | 7/1995 |
| WO | 2009-145140 A1 | 12/2009 |
| WO | 2010/024090 A1 | 3/2010 |

OTHER PUBLICATIONS

C.W. Tang, Appl. Phy. Lett. No. 48, 1996, p. 183.

S.E. Shaheen, Appl. Phys. Lett. No. 78, 2011, p. 841.

Bunshi Taiyo Denchi no Tenbo (Development of Molecular-based solar cells) by Hirishi Imahori, Shunichi Fukuzumi, Jul. 2001, p. 41 (Japan Chemical Industry Association), Abstract attached (Abstract of "The prospects of the molecular solar barrery").

Denki Kagaku (Electrochemistry) vol. 65, No. 11, p. 923 (1997), Abstract attached (Abstract of "The recent development of the polymer solid electrolyte").

J. Electrochem. Soc. vol. 143, No. 10, p. 3099 (1996).

Inorg. Chem. vol. 35, p. 1168 (1996).

International Search Report of PCT/JP2010/060245 dated Aug. 10, 2010.

Hou, J., et al.: "A new n-type low bandgap conjugated polymer P-co-CDT: synthesis and excellent reversible electrochemical and electrochromic properties", Advance Article online, The Royal Society of Chemistry, Oct. 21, 2008, pp. 6034-6036.

Usui, H., et al.: "Improved dye-sensitized solar cells using ionic nanocomposite gel electrolytes", Journal of Photochemistry and Photobiology A: Chemistry 164, 2004, pp. 97-101.

Chinese Office Action issued in Chinese Application No. 201080027326.3, dated Apr. 30, 2014.

* cited by examiner

PHOTOELECTRIC ELEMENT

TECHNICAL FIELD

The present invention relates to a photoelectric element for converting light into electricity.

BACKGROUND ART

In recent years, a variety of photoelectric elements are being used, including photoelectrochemical elements such as photoelectric conversion-based electricity-generating elements including photovoltaic batteries and solar batteries, light-emitting elements, electrochromic display elements, optical display elements such as electron papers, electrochemical elements such as batteries and electrostatic capacitors, non-volatile memories and arithmetic elements, electric elements such as transistors, sensor elements for detecting the temperature/humidity/amount of light/amount of heat/pressure/magnetic force or the like.

Required of an electron transport layer provided in these photoelectric elements is the property of high electron transport; in addition, the size of the surface area of the reaction interface is important, which is where electrons are generated by energies from outside and where electrons injected from outside act as well. In prior art, such electron transport layer is formed from metal, organic semiconductor, inorganic semiconductor, electro-conductive polymer, electro-conductive carbon or the like.

For instance, in a photoelectric conversion element, a electron transport layer for transporting electrons is made from an organic compound having electron as carriers, such as, fullerene, peryrene derivatives, polyphenylenevinylene derivatives and pentacene, the electron transport capabilities of these substances are improving the conversion efficiency (refer to Non-Patent Reference 1 regarding fullerene, refer to Non-Patent Reference 2 regarding peryrene derivatives, and refer to Non-Patent Reference 3 regarding polyphenylenevinylene derivatives).

In addition, in regard to molecular element-type solar batteries, forming a structure comprising chemically bonded electron-donating molecule (donor) and electron-accepting molecule (acceptor) into a thin film over a substrate has also been reported (refer to Non-Patent Reference 4).

Non-Patent Reference 1: P. Peumans, Appl. Phys. Lett., No. 79, 2001, p. 126

Non-Patent Reference 2: C. W. Tang, Appl. Phys. Lett., No. 48, 1986, p. 183

Non-Patent Reference 3: S. E. Shaheen, Appl. Phys. Lett., No. 78, 2001, p. 841

Non-Patent Reference 4: "Bunshi Taiyo Denchi no Tenbo (Development of molecular-based solar cells)" by Hiroshi Imahori, Shunichi Fukuzumi, July 2001 p. 41 (Japan Chemical Industry Association)

DISCLOSURE OF THE INVENTION

However, the electron transport layers reported in the above non-patent references do not have simultaneously a sufficient electron transport property and a sufficiently wide reaction interface to act as an electron transport layer. Therefore, the current situation is that an electron transport layer for electron transport having more excellent electron transport property and sufficiently wide reaction interface is desired.

For instance, in the case of an organic electron transport layer comprising a fullerene or the like, a charge recombination of the electron being likely to occur, the effective diffusion distance is not sufficient, such that further improvement of conversion efficiency is difficult. This effective diffusion distance refers to the distance until an electrode is reached after electric charge separation has occurred, and the larger the effective diffusion distance, the greater the conversion efficiency of the element. In addition, in the case of an inorganic electron transport layer such as of titanium oxide, the conversion efficiency is not sufficient, from such reasons as, the interface surface area of electric charge separation is not sufficient and the constituent elements determine unequivocally the electron conduction potential, which influences the open-circuit voltage.

Devised in view of the above problems, it is an object of the present invention to provide a photoelectric element having excellent conversion efficiency, provided with an electron transport layer having excellent electron transport property and sufficiently wide reaction interface.

The photoelectric element according to the present invention comprises a pair of electrodes, and an electron transport layer and a hole transport layer that are sandwiched between these electrodes, the electron transport layer comprising an organic compound having a redox moiety capable of being oxidized and reduced repeatedly and a gel layer containing the organic compound and an electrolyte solution that stabilizes the reduced state of the organic compound and the redox moiety, and a sensitizing dye being present within the gel layer.

In the present invention, the organic compound and the electrolyte solution in the electron transport layer constitute the gel layer, while at the same time, the sensitizing dye is present within the gel layer, whereby the reaction interface of the organic compound is enlarged, improving the conversion efficiency and the electron hand-over efficiency from the sensitizing dye to the organic compound in the electron transport layer, as a result of which the electron transport efficiency is improved.

The sensitizing dye is preferably immobilized within the gel layer by a physical or a chemical action with the organic compound constituting the gel layer.

In this case, the reaction interface of the electron transport layer becomes larger, further improving the efficiency of photoelectric conversion.

In the photoelectric element according to the present invention, it is desirable that the open-circuit voltage A (V) at the time point when light at 200 lux is radiated for 5 minutes and the open-circuit voltage B (V) at the time point when 5 minutes have elapsed from when the light is shielded at the above time point, satisfy the following relational expression:

$(B/A) \times 100 \geq 10$.

In the present invention, a redox potential of the electron transport layer may slope from noble to base in the direction toward the electrode in contact with this electron transport.

In the present invention, the electron transport layer may contain two or more species of organic compounds selected from imide derivatives, quinone derivatives, viologen derivatives and phenoxyl derivatives.

In the present invention, the hole transport layer 4 may contain an azaadamantane-N-oxyl derivative indicated in [Chem. 1] below:

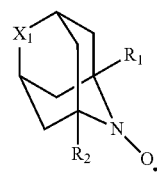

[Chem. 1]

($R_1$ and $R_2$ each independently represents a hydrogen, a fluorine, an alkyl group or a substituted alkyl group, and $X_1$ represents a methylene group or an N-oxyl group indicated in [Chem. 2])

[Chem. 2]

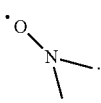

In the present invention, the azaadamantane-N-oxyl derivative may contain at least one species among azaadamantane-N-oxyl and 1-methyl-2-azaadamantane-N-oxyl.

In the present invention, an electro-conductive additive is present within the gel layer, while at least a portion of the electro-conductive additive may be in contact with the electrode.

In the present invention, a roughness factor of the electro-conductive additive may be 5 or greater but 2,000 or less.

In the present invention, the electro-conductive additive may be formed of an aggregation of particles of electro-conductive materials.

In the present invention, the electro-conductive additive may be formed of a fibrous electro-conductive material.

In the present invention, an average external diameter of the fibrous electro-conductive material may be 50 nm or greater but 1,000 nm or less.

In the present invention, a porosity of the electro conductive additive formed of the fibrous electro-conductive material may be 50% or greater but 95% or less.

In the present invention, an average fiber length/average fiber diameter ratio of the fibrous electro-conductive material may be 1,000 or greater.

According to the present invention, the electron transport property of the electron transport layer improves while the reaction interface becomes wide, improving the conversion efficiency of the photoelectric element.

BEST MODE FOR CARRYING OUT THE INVENTION

Embodiments of the present invention will be described below.

Figure 1:
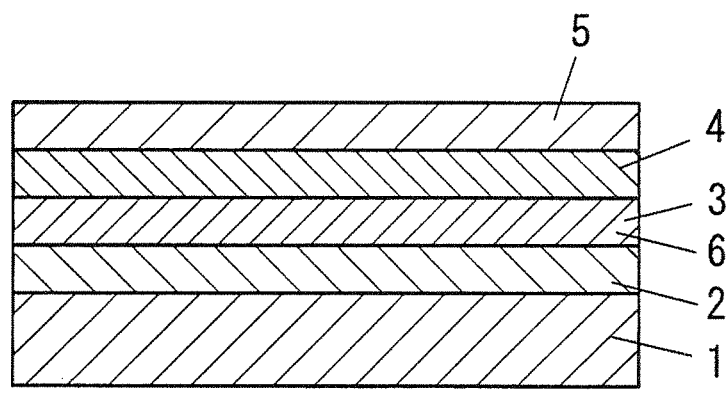
FIG. 1 is a cross-sectional overview showing an embodiment of the present invention.

As shown in FIG. 1, in the photoelectric element of the present embodiment, an electron transport layer 3 and a hole transport layer 4 are sandwiched between a pair of electrodes 2 and 5 (a first electrode 2 and a second electrode 5). The electron transport layer 3 includes an organic compound having a redox moiety. This organic-compound is swollen by containing an electrolyte solution, thereby forming a gel layer 6. That is to say, the electron transport layer 3 is formed of the organic compound that has the redox moiety and forms with the electrolyte solution the gel layer 6 within which the sensitizing dye is present.

The first electrode 2 is electrically connected to the electron transport layer 3 and extracts electrons from the electron transport layer 3 to the exterior or exerts the function of injecting electrons into the transport layer 3. In addition, it also has the function of physically retaining the electron transport layer 3. The exterior refers to a power circuit, a secondary battery, a capacitor and the like, which are electrically connected to the photoelectric element.

The first electrode 2 may be formed of a single film of electro-conductive material such as metal; in addition, an electro-conductive material may be layered over an insulating first substrate 1 such as glass or a film, whereby the first electrode 2 is formed on the first substrate 1. As preferred examples of electro-conductive materials, metals such as platinum, gold, silver, copper, aluminum, rhodium and indium; electro-conductive metal oxides such as carbon; indium-tin complex oxide, tin oxide doped with antimony and tin oxide doped with fluorine; complexes of the above metals or compounds; materials comprising silicon oxide, tin oxide, titanium oxide, zirconium oxide, aluminum oxide, or the like, coated over the above metals or compounds, and the like, may be cited. While the lower the surface resistance of the first electrode 2, the better, preferably, the surface resistance is 200Ω/□ or lower, and more preferably 50Ω/□ or lower. While there is no particular restriction on the lower limit of this surface resistance, it is in general 0.1Ω/□.

The first electrode 2 may have optical transparency. In this case, light from the outside may be injected into the photoelectric element 1 through this first electrode 2. It is desirable that the first electrode 2 is transparent so as to allow light to be transmitted. In this case, the first electrode 2 is formed for instance of a transparent electro-conductive material or the like. In addition, the first electrode 2 may have an opening, so that the first electrode 2 allows light to be transmitted via the opening. As the opening formed in the first electrode 2, for instance, opening in the form of a slit or in the form of a hole may be cited. The shape of the opening in the form of a slit may be any shape such as a straight line, a wave line or a grid. Electro-conductive particles may be arranged to form the first electrode 2, while at the same time, openings may be formed between these electro-conductive particles. When the first electrode 2 having such openings is formed, a transparent electro-conductive material becomes unnecessary, allowing for a reduction of material costs.

When the first electrode 2 is transparent, the higher the light transmittance of the first electrode 2, the better. The preferred range of light transmittance for the first electrode 2 is 50% or greater, and more preferably 80% or greater. The thickness of the first electrode 2 is preferably in the range of 1 to 100 nm. The reason is that, if the thickness is in this range, an electrode film having a uniform film-thickness can be formed, and in addition, sufficient light can be injected into the electron transport layer 3 without decreasing the optical transparency of the first electrode 2. When a transparent first electrode 2 is used, light is preferably injected from this first electrode 2 on the side where the electron transport layer 3 is deposited.

In forming the first electrode 2 over the first substrate 1, when the photoelectric element requires light to pass through the first substrate 1 similarly to an electricity-generating element, a light-emitting element, a light sensor, or the like, it is desirable that the light transmittance of the first substrate 1 is high. The preferred light transmittance in this case is 50% or greater at a wavelength of 500 nanometers, and more preferably 80% or greater. In addition the thickness of the first electrode 2 is preferably within the range of 0.1 to 10 µm. Within this range, the first electrode 2 can be formed with a uniform thickness, in addition a drop in optical transparency of the first electrode 2 can be suppressed, allowing sufficient light to be injected through the first electrode 2 into the electron transport layer 3.

When forming the first electrode 2 by providing a layer of transparent electro-conductive oxide over a first substrate 1, for instance, a vacuum process such as sputter method or vapor deposition method may be used over a light-transmitting substrate comprising glass, resin, or the like, or, a layer of transparent electro-conductive oxide comprising indium oxide, tin oxide, zinc oxide, or the like, may be formed into a film by a wet method such as spincoat method, spray method or screen printing to form the first electrode 2.

The organic compound constituting the electron transport layer 3 has, as an intramolecular portion thereof, a redox moiety capable of being oxidized and reduced repeatedly, and at the same time, has as another portion, a domain that swells to become a gel (gel domain) by including an electrolyte solution. The redox moiety is chemically bonded to the gel domain. While the positional relationship within the molecule between the redox moiety and the gel domain is not limited in particular, for instance, when a backbone such as the main chain of the molecule is formed with the gel domain, the redox moiety is bonded to the main chain as a side chain. In addition, a structure in which a molecular backbone forming a gel domain and a molecular backbone forming a redox moiety are alternately bonded is also adequate. When a redox moiety and a gel domain are present within one identical molecule of organic compound in this manner, the redox moiety can be retained in the gel layer 6 forming the electron transport layer 3 so as to remain at a location where transporting electrons is straightforward.

The organic compound having the redox moiety and the gel domain may be a small molecule or a macromolecule. When it is a small molecule, an organic compound forming a so-called small molecule gel through hydrogen bonds, or the like, can be used. In addition, in the case of a macromolecule, an organic compound having a number average molecular weight of 1,000 or greater is desirable, as it can spontaneously exert the function of gelation. Although the upper limit of the molecular weight of the organic compound in the case of a macromolecule is not limited in particular, 1,000,000 or less is desirable. In addition, it is desirable that the state of the gel in the gel layer 6 is, for instance, the form of a konjac food or a form similar to an ion exchange film in external appearance, although there is no particular limitation.

In addition, the redox moiety designates a domain that reversibly becomes an oxidant and a reductant in an oxido-reduction reaction. In addition, the redox moiety is preferably a substance constituting an oxido-reduction system in which the oxidant and the reductant have an identical electric charge.

Thusly, since the electron transport layer 3 is provided with an organic compound having a redox moiety capable of being oxidized and reduced repeatedly and, moreover, the organic compound contains an electrolyte solution that stabilizes the reduced state of the redox moiety, the electron transport layer 3, which, formed as the gel layer 6, allows the structure to be fragmented at the molecule level, can have the reaction interface enlarged, and can transport electrons efficiently and at a rapid reaction rate.

Here, oxido-reduction (oxido-reduction reaction) refers to an ion, an atom or a compound donating and accepting an electron, and redox moiety refers to a domain that can stably donate and accept an electron by oxido-reduction reaction (redox reaction).

In addition, gel layer 6 refers to a layer formed by an organic compound having a redox moiety being swollen with an electrolyte solution. That is to say, in the gel state, the organic compound adopts a three-dimensional network structure, and a layer in a state in which the interior of this network is filled with liquid is referred to as the gel layer 6.

Forming the gel layer 6 by swelling the organic compound having the redox moiety with an electrolyte solution in this way allows the redox moiety to be retained in the vicinity of the first electrode 2 and the organic compound to be retained in such a way that redox moieties that are next to each other are at a distance that is sufficiently close to exchange an electron among them. In addition, redox moieties can exist at a high density in the electron transport layer 3 which can realize an extremely rapid electron self-exchange reaction rate constant, allowing the electron transport capability to be raised. Furthermore, forming the electron transport layer 3 as an organic compound gel layer 6 facilitates giving the electron transport layer 3 adhesiveness or giving the electron transport layer 3 flexibility or optical transparency.

In addition, since the redox moiety is present within the molecule of organic compound forming the gel layer 6 as described above, retention of the redox moiety by the gel layer 6 in a state in which electron transport by the repetition of oxido-reduction reaction is more effectively carried out is facilitated. That is to say, since the redox moiety is chemically bonded to the organic compound forming the gel layer 6, the redox moiety can be retained with the gel layer 6 so as to remain at a position where transporting electron is straight forward. The positional relationship of the redox moiety within the organic compound may be, for instance, a structure in which the redox moiety is arranged as a side chain with respect to the backbone of the organic compound forming the gel layer 6, or the backbone of the organic compound and the redox moiety may be bonded by being arranged alternately or partially continuously.

Then, the redox moiety is one that can transport electrons by electron exchange reaction between redox moieties, and not by diffusion. This electron exchange reaction is a reaction in which a redox moiety in an oxidized state oxidizes a neighboring redox moiety in a reduced state, exchanging an electron among the redox moieties, whereby, in appearance, an electron is transported within the layer of the electron transport layer 3. While the function resembles that of an ion conductive material in which ions are transmitted by diffusion, the electron transport mechanism in the electron transport layer 3 of the present embodiment is different on the point that the redox moieties transport electrons by exchange with neighboring redox moieties, not by diffusion. While the redox moieties need to be near one another also in the electron transport layer 3 of the present embodiment in order to hand an electron over to a neighboring redox moiety so as to allow for electron displacements, since the redox moiety is retained by the gel layer 6, the distance of displacement is expected to be few ångströms. In particular, when the redox moiety is present within a molecule of organic compound forming the gel layer 6 as in the present embodiment, the reaction of electron exchange with a neighboring redox moiety is a reaction called electron self-exchange reaction.

While a photoelectric conversion element provided with a solid ion conductor containing an oxido-reduction system in a macromolecular compound is described in Japanese Patent Application Laid-open No. H07-288142, this ion conductor is a hole transport material, not an electron transport material.

In the electron transport layer 3 of the photoelectric element of the present embodiment, by retaining the redox moiety in the gel layer 6 as described above, the field of the reaction for converting light into electricity or electricity into light, that is to say, the reaction interface, can be enlarged without compromising electron transportability, allowing a photoelectric element having high conversion efficiency to be obtained.

The reaction interface here refers to the interface between the electron transport layer 3 and a hole transport material or the electrolyte solution. For instance, since electric charges generated by light absorption are separated at the reaction interface in a photoelectric conversion element, the wider the reaction interface the higher the conversion efficiency, and in contrast to prior art where the surface area of the reaction interface could not be enlarged sufficiently, with the present embodiment, since the gel layer 6 is formed by including the electrolyte solution in the organic compound having the redox moiety as described above, the reaction interface between the redox moiety and the electrolyte solution that penetrated the electron transport layer 3 becomes large, allowing the conversion efficiency to be raised. The following two points are considered as reasons for the reaction interface to be enlarged. The first is the consideration that, with an electron transport material comprising a prior art inorganic semiconductor or the like, even if it is turned into a microparticle, reaching sub-nanometer scale is difficult due to the material being inorganic, while, in contrast, the electron transport layer 3 of the present embodiment allows the structure to be fragmented at the molecular level if the redox moiety is in a state that can undergo oxido-reduction and transport electrons, which allows the surface area of the interface needed for electric charge separation to be increased. In particular, when the electron transport layer 3 is formed from a macromolecular organic compound, ångström-scale interface formation is possible, theoretically. As the second reason, the possibility is considered that, at the interface between the redox moiety of the organic compound constituting the electron transport layer 3 and the hole transport layer 4, the electrolyte solution, or the like, a special interface state is formed, which may promote electric charge separation.

In addition, since the electron transport layer 3 is formed with an organic compound having a redox moiety, design or synthesis according to electrical properties such as electric potential or structural properties such as molecule size is facilitated, and furthermore, the control, or the like, of gelation or solubility is possible. In addition, since the electron transport layer 3 is formed with an organic compound, high temperature firing such as when forming a layer of electron transport material with an inorganic material such as an inorganic semiconductor is unnecessary, which is an advantage in the manufacturing process, and in addition, the electron transport layer 3 can be rendered flexible. In addition, the facts that, unlike inorganic materials and noble metal materials, the organic compound has no problem of resource depletion, has low toxicity, allows heat energy to be recovered by incineration when being discarded, and the like, can also be cited as advantages.

Furthermore, in the present embodiment, the organic compound forming the electron transport layer 3 contains an electrolyte solution as described above, thereby allowing the reduced state of the redox moiety present within the organic compound to be stabilized, and allowing electrons to be transported more stably. That is to say, while organic compounds are considered difficult to use as materials for the electron transport layer 3 since the reduced state is unstable compared to inorganic compounds such as metal semiconductors and metal oxide semiconductors which are generally used as electron transport materials, by giving a structure that contains an electrolyte solution, the ionic state formed by the oxido-reduction reaction of the redox moiety is compensated by counter-ions in the electrolyte solution, that is to say, for instance, a redox moiety turned into a cationic state is stabilized by the opposite electric charge from an anion in the electrolyte solution, furthermore, the reduced state can be stabilized by the action of the solvent such as solvation or dipolar moment, which, as a result, can stabilize the redox moiety.

Here, a physical index of the gel layer 6 that has an influence on the size of the reaction interface is the swelling degree. The swelling degree mentioned here is represented by the following formula:

Swelling degree (%)=(weight of gel)/(weight of dried gel)×100

A dried gel designates a gel that has been dried. This drying of gel designates the removal of the solution included in the gel, and in particular the removal of the solvent. In addition, as methods for drying a gel, removal of a solution or a solvent in a heated, vacuum environment, removal of the solution or the solvent included in the gel by another solvent, and the like, may be cited.

The swelling degree of the gel layer 6 is preferably 110 to 3,000%, and more preferably 150 to 500%. If less than 110%, there is a risk that sufficient stabilization of the oxido-reduction site is not carried out due to fewer electrolyte components in the gel, and in addition, if 3,000% is exceeded, there is a risk that there are fewer oxido-reduction sites in the gel, which decreases the electron transport capability; in either case the property of the photoelectric element decrease.

Such an organic compound having a redox moiety and a gel domain within one molecule as described above can be represented by the following general formula:

$(X_i)_n$ represents the gel domain and $X_i$ represents the monomer of the compound forming the gel domain. The gel domain is formed with a polymer backbone. The polymerization degree n of the monomer is preferably in the range of n=1 to 100,000. Y represents the redox moiety bonded to $(X_i)_n$. In addition, j and k are any integers respectively representing the number of $(X_i)$, and Y contained within one molecule, both being preferably in the range of 1 to 100. The redox moiety Y may be bonded to any site on the polymer backbone forming the gel domain $(X_i)_n$. In addition, the redox moiety Y may contain a site of a different species, in which case a site with a close redox potential is desirable from the point of view of electron exchange reaction.

As such organic compounds having a redox moiety and a gel domain within one molecule, polymers having a quinone derivative backbone comprising chemically bonded quinones, polymers having an imide derivative backbone containing imide, polymers having a phenoxyl derivative backbone containing phenoxyl, polymers having a viologen derivative backbone containing viologen, and the like, may be cited. In these organic compounds, the respective polymer backbones are gel domains, and the quinone derivative backbone, the imide derivative backbone, the phenoxyl derivative backbone and the viologen derivative backbone are respectively redox moieties.

Among the organic compounds mentioned above, as examples of polymers having a quinone derivative backbone comprising chemically bonded quinones, those having the chemical structures of [Chem. 1] to [Chem. 4] indicated below may be cited. In [Chem. 1] to [Chem. 4], R represents saturated or unsaturated hydrocarbons such as methylene, ethylene, propane-1,3-dienyl, ethylidene, propane-2,2-diyl, alkanediyl, benzylidene, propylene, vinylidene, propene-1,3-diyl and but-1-en-1,4-diyl; cyclic hydrocarbons such as cyclohexanediyl, cyclohexenediyl, cyclohexadienediyl, phenylene, naphthalene and biphenylene; ketos such as oxaryl, malonyl, succinyl, glutanyl, adipoyl, alkanedioyl, sebacoyl, fumaroyl, maleoyl, phthaloyl, isophthaloyl and terephthaloyl, divalent acyl groups; ethers such as oxy, oxymethylenoxy and oxycarbonyl, esters; groups containing sulfur such as sulfanediyl, sulfanyl and sulfonyl; groups containing nitrogen such as imino, nitrilo, hydrazo, azo, azino, diazoamino, urelene and amido; groups containing silicon such as silane diyl and disilane-1,2-diyl; or groups comprising these groups substituted or complexed at their extremities.

[Chem. 3] is an example of organic compound constituted by an anthraquinone being chemically bonded to the polymer main-chain. [Chem. 4] is an example of organic compound constituted by an anthraquinone being incorporated as a repetitive unit into the polymer main chain. In addition, [Chem. 5] is an example of organic compound in which anthraquinone is a crosslinking unit. Furthermore, [Chem. 6] shows an example of anthraquinone having a proton-donor group forming an intramolecular hydrogen bond with an oxygen atom.

[Chem. 3]

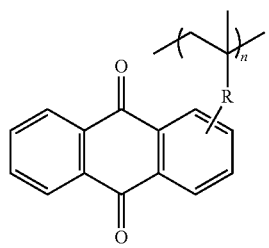

[Chem. 4]

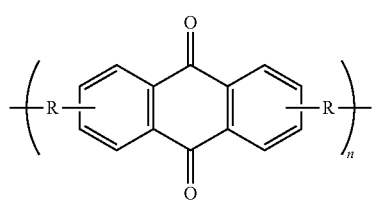

[Chem. 5]

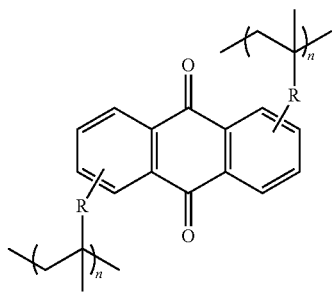

[Chem. 6]

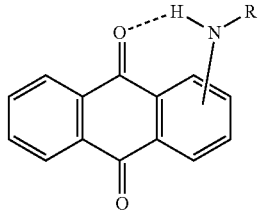

The quinone polymer described above enables a high-performance redox reaction that is not rate-limited by proton movements, and is provided with chemical stability that can endure long-term use, with no presence of electronic interaction between quinone groups, which are redox sites (redox moieties). Moreover, since this quinone polymer does not elute out into the electrolyte solution, it is useful on the point of being retained in the first electrode 2 to form the electron transport layer 3.

In addition, as polymers having an imide derivative backbone in which the redox moiety Y contains imide, polyimides indicated in [Chem. 7] and [Chem. 8] can be used. Here, in [Chem. 7] and [Chem. 8], $R_1$ to $R_3$ represent aromatic groups such as 1,4-phenylene group and 1,3-phenylene group, or aliphatic chains such as alkylene group and alkyl ether, and allow the polyimides as described above to be obtained by heat-imidation. The polyimide polymer backbone may be crosslinked at the $R_1$ to $R_3$ portions, and in addition, may have no crosslinked structure if it only swells in the used solvent without eluting. If crosslinked, this portion corresponds to the gel domain. In addition, when introducing a crosslinked structure is introduced circumstance, an imide group may be included in the crosslinking unit. If electrochemically reversible oxido-reduction properties are exhibited, the imide group may preferably be phthalimide or pyromellitimide.

[Chem. 7]

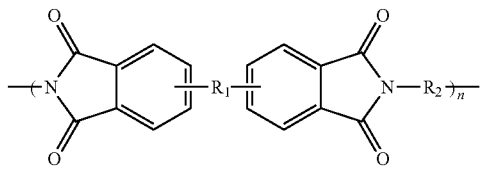

[Chem. 8]

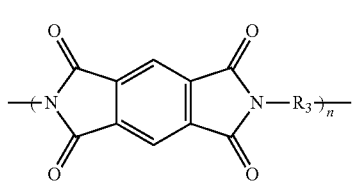

In addition, as polymers having a phenoxyl derivative backbone containing phenoxyl, for instance, galvi compounds such as indicated in [Chem. 9] may be cited. In this galvi compound, the galvinoxyl group (refer to [Chem. 10]) corresponds to the oxido-reduction site Y and the polymer backbone corresponds to the gel domain X.

[Chem. 9]

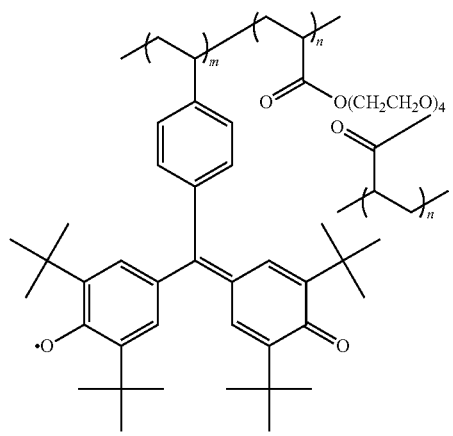

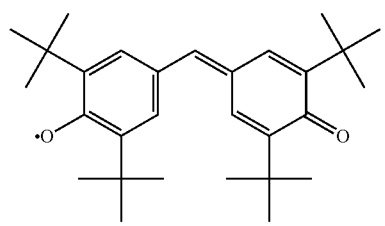

[Chem. 10]

In addition, as polymers having a viologen derivative backbone containing viologen, polyviologen polymers such as indicated in [Chem. 11] may be cited.

[Chem. 11]

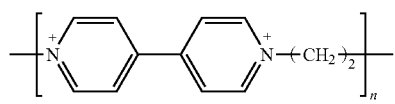

In addition, as polymers having a viologen derivative backbone containing viologen, viologen compounds such as indicated in [Chem. 12] and [Chem. 13] may be cited. In these viologen compounds, [Chem. 14], corresponds to the redox moiety Y and the polymer backbone corresponds to the gel domains $(X_i)_n$ and $(X_i)_{nj}$.

[Chem. 12]

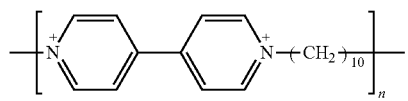

[Chem. 13]

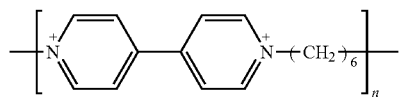

[Chem. 14]

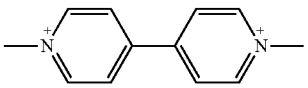

In [Chem. 3] to [Chem. 13], m and n indicate the polymerization degree for the monomer, preferably in the range of 1 to 100,000.

The organic compound having a redox moiety and a polymer backbone described above forms the gel layer 6 as the polymer backbone swells by containing an electrolyte solution between the backbones thereof. By including an electrolyte solution in the electron transport layer 3 in this way, the ionic state formed by oxido-reduction reaction of the redox moiety is compensated by counter ions in the electrolyte solution, allowing the redox moiety to be stabilized.

An electrolyte solution containing an electrolyte and a solvent is sufficient. As electrolytes, support salts and oxido-reduction system constitutive substances made of an oxidant and a reductant may be cited, among which, either one or both being adequate. A support salts (support electrolytes), for instance, ammonium salts such as tetrabutylammonium perchlorate, tetraethylammonium hexafluorophosphate, imidazolium salts and pyridinium salts, alkaline metal salts such as lithium perchlorate and potassium tetrafluoroborate, and the like, may be cited. Oxido-reduction system constitutive substances mean substances existing reversibly in the forms of an oxidant and a reductant in an oxido-reduction reaction, and as such oxide-reduction system constitutive substances, for instance, chlorine compound-chlorine, iodine compound-iodide, bromine-compound-bromine, thallium ion (III)-thallium ion (I), mercury ion (II)-mercury ion (I), ruthenium ion (III)-ruthenium ion (II), copper ion (II)-copper ion (I), iron ion (III)-iron ion (II), nickel ion (II)-nickel ion (III), vanadium ion (III)-vanadium ion (II), manganate ion-permanganate ion, and the like, may be cited, with no limitation thereto. In this case, they function distinctly from the redox moiety within the electron transport layer 3.

In addition, as solvents constituting the electrolyte solution, those containing at least any one among water, organic solvent and ion liquid may be cited.

Using water or an organic solvent as a solvent for the electrolyte solution can stabilize the reduced state of the redox moiety of the organic compound, allowing electrons to be transported more stably. While either of aqueous solvents and organic solvents can be used as the solvent, an organic solvent having excellent ion conductivity is desirable in order to stabilize the redox moiety further. As such organic solvents, for instance, carbonate compounds such as dimethyl carbonate, diethyl carbonate, methylethyl carbonate, ethylene carbonate and propylene carbonate, ester compounds such as methyl acetate, methyl propionate and γ-butyrolactone, ether compounds such as diethyl ether, 1,2-dimethoxy ethane, 1,3-dioxosilane, tetrahydrofuran and 2-methyl-tetrahydrofuran, heterocyclic compounds such as 3-methyl-2-oxazolidinone and 2-methylpyrrolidone, nitrile compounds such as acetonitrile, methoxy acetonitrile and propionitrile, aprotic polar compounds such as sulfolane, dimethyl sulfoxide and dimethyl formamide, and the like, may be cited. These solvents can each be used alone or two or more species can be mixed and used in combination. In addition, when the photoelectric element is formed in particular as a photoelectric conversion element, from the point of view of improving the solar battery output properties thereof, the solvent is preferably carbonate compounds such as ethylene carbonate and propylene carbonate, heterocyclic compounds such as γ-butyrolactone, 3-methyl-2-oxazolidinone and 2-methylpyrrolidone, nitrile compound such as acetonitrile, methoxy acetonitrile, propionitrile, 3-methoxy propionitrile and valeric acid nitrile.

In addition, if an ion liquid is used as the solvent for the electrolyte solution, the redox moiety-stabilizing action is particularly improved. Moreover, an ion liquid has excellent stability since it is not volatile and is highly non-flammable. Well known ionic liquids can all be used as the ion liquid, for instance, ionic liquids such as of the imidazolium series, such as 1-ethyl-3-methylimidazolium tetracyanoborate, the pyridine series, the alicyclic amine series, the aliphatic amine series, the azonium amine series, and those described in the description of European patent publication No. 718288, NO 95/18456, Denki Kagaku (Electrochemistry) Volume 65, No. 11 p. 923 (1997), J. Electrochem. Soc. Volume 143, No. 10, p. 3099 (1996) and Inorg. Chem. Volume 35, p. 1168 (1996) can be cited.

The electron transport layer 3 can be formed by providing on the surface of the first electrode 2, the gel layer 6 formed with an organic compound having an electrolyte solution and a redox moiety such as described above. The electron transport layer 3 refers to a layer in which electrons behave as dopants and, for instance, refers to a layer having a redox moiety which redox potential is more noble than +100 mV with respect to a silver/silver chloride reference electrode.

From the point of view of maintaining satisfactory electron transportability, the thickness of the electron transport layer 3 is preferably in the range of 10 nm to 10 mm and particularly preferably in the range of 100 nm to 100 μm. This thickness allows both the electron transport property and the interface surface area of the electron transport layer 3 to be at high levels.

In providing the electron transport layer 3 on the surface of the first electrode 2, while the method of depositing an organic compound on the surface of first electrode 2, for instance, by a vacuum process such as sputter method or vapor deposition method, can be adopted, a wet-type forming method whereby the first electrode 2 is coated with a solution containing an organic compound, or the like, is desirable, owing to being a simpler ad lower-cost preparation method. In particular, when forming the electron transport layer 3 with a so-called high-molecular weight organic compound having a number average molecular weight of 1,000 or greater, a wet-type forming method is desirable from the point of view of formability. As wet-type processes, spincoat method, dropcast method obtained by dripping and drying a drop of liquid, printing methods such as screen printing and gravure printing, and the like, may be cited.

The electron transport layer 3 may be formed in such a way that the redox potential slopes from noble to base in the direction toward the first electrode 2 in contact with the electron transport layer 3, that is to say, the value of the redox potential on the side that is close to the first electrode 2 is more base than the redox potential on the side that is far from the first electrode 2. If the redox potential of the electron transport layer 3 slopes from noble to base in the direction toward the first electrode 2 in contact with the electron transport layer 3 in this way, this gradient of redox potential can create a flow of electrons within the electron transport layer 3, increasing the transportability of electrons from the electron transport layer 3 to the first electrode 2 that is in contact with the electron transport layer 3, allowing the conversion efficiency to be raised further.

A method for forming the electron transport layer 3 in which the redox potential has a gradient as described above, for instance, there is the method whereby, in forming the electron transport layer 3 using a plurality of organic compounds with different redox potentials and layering layers of each organic compound, the organic compounds are combined in such a way that the redox potential of the organic compound forming the layer on the side that is close to the first electrode 2 has a higher value than the redox potential of the organic compound forming the layer on the side that is far from the first electrode 2. For instance, in the example of FIG. 2, two layers 31 and 32 are layered to form the electron transport layer 3, with the species of the organic compounds forming the layers 31 and 32 being selected so that the redox potential of the organic compound forming the layer 31 on the side that is close to the first electrode 2 is base and the redox potential of the organic compound forming the layer 32 that is far from the first electrode 2 is noble. Obviously, the electron transport layer 3 may be formed from a laminate of three or more layers, in which case, the more a layer is on the side that is close to the first electrode 2, the more base is the redox potential set to, sequentially.

If an imide derivative, a quinone derivative, a viologen derivative or a phenoxyl derivative is used as the organic compound for forming the electron transport layer 3 as described above, the electron transport layer 3 can be formed by combining two or more species of these organic compounds so that the redox potential slopes from noble to base in the direction toward the first electrode 2 in contact with the electron transport layer 3.

Well known materials can be used as the sensitizing dye of the present embodiment and, for instance, 9-phenyl xanthene dyes, coumarin dyes, acridine dyes, triphenyl methane dyes, tetraphenyl methane dyes, quinone dyes, azo dyes, indigo dyes, cyanine dyes, merocyanine dyes, xanthene dyes, and the like, may be cited. As sensitizing dyes, ruthenium-cis-diaqua-bipyridyl complex of the RuL$_2$ (H$_2$O)$_2$ type (where L represents 4,4'-dicarboxyl-2,2'-bipyridine); transition metal complexes of such types as ruthenium-tris (RuL$_3$), ruthenium-bis(RuL$_2$), osmium-tris (OsL$_3$) and osmium-bis (OsL$_2$); zinc-tetra(4-carboxyphenyl)porphyrin, iron-hexacyanide complex, phthalocyanine, and the like, may also be cited. In addition, as sensitizing dye, for instance, dye present in the DSSC chapter of "Advanced technologies and Material Development of FPD, DSSC, Optical Memory, and Functional Dye" (N.T.S. Inc.) can also be applied. In particular, from the point of view of promoting electric charge separation during photoelectric conversion, dyes having associative properties are desirable. Dyes forming assembly and are effective, for instance, dyes indicated by the structural formula of [Chem. 15] are desirable.

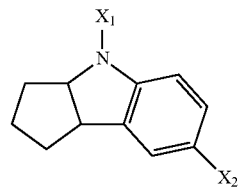

[Chem. 15]

In the structural formula, X$_1$ and X$_2$ each independently represents an alkyl group, an alkenyl group, an aralkyl group, an aryl group, a heterocycle, or an organic group having at least one or more species of these groups, each being optionally substituted. Such dyes as [Chem. 15] above are known to be associating. In this case, the recombination of the electron and the positive hole present in the electron transport material and the hole transport material can be reduced dramatically, therefore conversion efficiency of the photoelectric conversion element can be improved.

This sensitizing dye is a sensitizing dye that is present within the gel layer 6, and in particular, the sensitizing dye is preferably immobilized within the gel layer 6 by a physical or chemical action or the like between itself and an organic compound constituting the gel layer 6.

"Sensitizing dye is present within the gel layer 6" means that the sensitizing dye is present not only at the surface layer of the gel layer 6 but also inside thereof. This allows a state in which the amount of sensitizing dye present within the gel layer 6 is at a certain value or greater to be maintained continuously, exerting an output improvement effect for the photoelectric element. The sensitizing dye is preferably present through the entirety of the interior of the gel layer 6.

The "state in which the sensitizing dye is present within the gel layer 6" includes the "state in which the sensitizing dye is present in the electrolyte solution constituting the gel layer 6" and the "state in which the sensitizing dye is present in the gel layer 6 by physically/chemically interacting with an organic compound constituting the gel layer 6".

The "state in which the sensitizing dye is retained in the gel layer 6 by physical interaction with an organic compound constituting the gel layer 6" includes, for instance, a state in which an organic compound having a structure that interferes with the movements of the molecule of sensitizing dye is used as the organic compound constituting the gel layer 6. As structures that interfere with the movements of the molecule of sensitizing dye, structures whereby an organic compound exerts a steric hindrance through various molecular chains such as an alkyl chain, or, structures in which the size of the space present between the molecular chains of the organic compound is reduced to such extent that movements of the molecule of sensitizing dye can be suppressed, and the like, may be cited.

Giving the sensitizing dye an element for the purpose of exerting physical interactions is also effective. Concretely, giving the sensitizing dye a structure that exerts steric hindrance through various molecular chains such as an alkyl chain may be cited. In addition, bonding two or more sensitizing dyes is also effective. In order to form a bond between sensitizing dyes it is effective to utilize saturated hydrocarbons such as methylene, ethylene, propane-1,3-dienyl, ethylidene, propane-2,2-diyl, alkanediyl, benzylidene and propylene, unsaturated hydrocarbons such as vinylidene, propene-1,3-diyl and but-1-en-1,4-diyl, cyclic hydrocarbons such as cyclohexanediyl, cyclohexenediyl, cyclohexadienediyl, phenylene, naphthalene and biphenylene, ketos such as oxaryl, malonyl, succinyl, glutanyl, adipoyl, alkanedioyl, sebacoyl, fumaroyl, maleoyl, phthaloyl, isophthaloyl and terephthaloyl, divalent acyl groups, ethers such as oxy, oxymethylenoxy and oxycarbonyl, esters, groups containing sulfur such as sulfanediyl, sulfanyl and sulfonyl, groups containing nitrogen such as imino, nitrilo, hydrazo, azo, azino, diazoamino, urelene and amido, groups containing silicon such as silanediyl and disilane-1,2-diyl, or groups comprising these groups substituted or complexed at their extremities. The above moiety is preferably bonded to the sensitizing dye via an optionally substituted, linear or branched alkyl group, for instance methyl, ethyl, i-propyl, butyl, t-butyl, octyl, 2-ethylhexyl, 2-methoxyethyl, benzyl, trifluoromethyl, cyanomethyl, ethoxycarbonyl methyl, propoxyethyl, 3-(1-octylpyridinium-4-yl)propyl, 3-(1-butyl-3-methylpyridinium-4-yl) propyl or the like, or an optionally substituted, linear or branched alkenyl group, for instance, vinyl, allyl or the like.

In addition, the "state in which the sensitizing dye is present in the gel layer 6 by chemical interaction with an organic compound constituting the gel layer 6" includes a state in which the sensitizing dye is retained within the gel layer 6, for instance, by a covalent bond, a coordinate bond, an ionic bond, a hydrogen bond, a van der Waals bond, or the like, or an interactions such as a force based on a hydrophobic interaction, a hydrophilic interaction or an electrostatic interaction, and the like. In particular, if a sensitizing dye is immobilized within the gel layer 6 by a chemical interaction between the sensitizing dye and the organic compound constituting the gel layer 6, the distance between the sensitizing dye and the organic compound becomes close, allowing an efficient electron movement to be generated.

When immobilizing the sensitizing dye within the gel layer 6 by a chemical interaction between the sensitizing dye and the organic compound, it is desirable to provide a functional group suitably to the organic compound and the sensitizing dye, and immobilizing the sensitizing dye with respect to the organic compound by a chemical reaction or the like mediated by this functional group. As such functional groups, hydroxyl group, carboxyl group, phosphate group, sulfo group, nitro group, alkyl group, carbonate group, aldehyde group, thiol group, and the like, may be cited. In addition, as reaction forms of the chemical reaction mediated by this functional group, condensation reaction, addition reaction, ring-opening reaction, and the like, may be cited.

In addition, when chemically bonding the sensitizing dye and the organic compound constituting the gel layer 6, it is desirable that the functional group in the sensitizing dye is introduced close to the site where the electron density becomes higher when this sensitizing dye is in the light-excited state, and that the functional group in the organic compound within the gel layer 6 is introduced close to the site participating to electron transport within this organic compound. In this case, an improvement in the efficiency of electron movement from the sensitizing dye to the organic compound and in the efficiency of electron transport within the organic compound is intended. In addition, bonding with a bonding group between the sensitizing dye and the organic compound constituting the gel layer 6, which has a high electron transportability that links the electron cloud of the sensitizing dye and the electron cloud of the organic compound, in particular, enables efficient electron movement from the sensitizing dye to the organic compound. Concretely, examples using an ester bond having a $\pi$ electron system, or the like, may be cited as a chemical bond linking the $\pi$ electron cloud of the sensitizing dye and the $\pi$ electron cloud of the organic compound.

In addition, the timing for bonding the sensitizing dye and the organic compound may be any among when the organic compound is in the monomeric state, when the organic compound polymerizes, after the organic compound has polymerized, when the organic compound gels and when the organic compound has gelled. As examples of concrete techniques, the technique of immersing the electron transport layer 3 formed from the organic compound into a bath containing the sensitizing dye, the method of coating the first electrode 2 with a coating solution containing the organic compound and the sensitizing dye to form a film thereby forming the electron transport layer 3, and the like, may be cited, and in addition, a plurality of methods may be combined.

While the sensitizing dye content within the gel layer 6 is set suitably, if the sensitizing dye content is 0.1 parts by mass or greater with respect to 100 parts by mass of the organic compound in particular, the amount of sensitizing dye per unit film-thickness of the gel layer 6 becomes sufficiently high, improving the light absorption capability of the sensitizing dye and raising the electric current value. In addition, if the sensitizing dye content is 1,000 parts by mass or less with respect to 100 parts by mass of the organic compound in particular, intercalation of an excessive amount of sensitizing dye between the organic compounds is suppressed, and inhibition by the sensitizing dye of electron movement within the organic compound is suppressed, ensuring high electrical conductivity.

At the same time as the electro-conductive additive 8 is present within the gel layer 6, at least a portion of this electro-conductive additive 8 may be in contact with the first electrode 2. In this case, electron transport property in the electron transport layer 3 can be improved. This allows the efficiency of conversion of light and electricity with the photoelectric element to be improved. That is to say, the reaction interface is enlarged by having the organic compound and the electrolyte solution of the electron transport layer 3 form the gel layer 6, moreover, electron transport property electron transport layer 3 is improved by the presence of the electro-conductive additive 8 within the gel layer 6, allowing the efficiency of light-electricity interconversion by the photoelectric element to be improved.

The roughness factor of the electro-conductive additive 8 is preferably 5 or greater but 2,000 or less. The roughness factor designates the ratio of the real surface area against the projected surface area. This projected surface area corresponds to the projected surface area of the gel layer 6. Regarding the real surface area, for instance if the electro-conductive additive 8 is constituted with n spherical electro-conductive materials having a diameter of r, the real surface area of the electro-conductive additive 8 is $n \times 4 \times \pi \times r^2$. When this real surface area of the electro-conductive additive 8 cannot be determined from the shape of the electro-conductive additive 8, it may be determine by the nitrogen adsorption method. In this case, the electricity-collection effect of the gel layer 6 rises, and at the same time, the side reaction at the surface of the electro-conductive additive 8 is suppressed, further improving the conversion efficiency.

The electro-conductive additive 8 may be formed of an aggregation of particles of electro-conductive materials. In this case, by solely mixing particles of electro-conductive material to a gel formed from the organic compound and the electrolyte solution of the electron transport layer 3, electron transport property in the electron transport layer 3 can be improved, further improving the conversion efficiency.

In addition, as another aspect, the electro-conductive additive 8 may be formed from a fibrous electro-conductive material. In this case, since the electro-conductive material is fibrous, reinforcing the strength of the electro-conductive additive 8 formed from this electro-conductive material to form the electro-conductive additive 8 with high porosity is facilitated. Therefore, forming the electron transport layer 3 or the gel layer 6 in the voids of the electro-conductive additive 8 is facilitated.

The average external diameter of the fibrous electro-conductive material is preferably 50 nm or greater but 1,000 nm or less. This average external diameter of electro-conductive material is the mean value of the external diameter of the electro-conductive material as measured from the results of observation by an electron microscope such as SEM (number of measurements: 30). In this case, the strength of the electro-conductive additive 8 can be improved further to form an electro-conductive additive 8 with high porosity, and at the same time, the specific surface area of the electro-conductive additive 8 can be enlarged sufficiently, further improving the output of the photoelectric element.

The porosity of the electro-conductive additive 8 formed from the fibrous electro-conductive material may be 50% or greater but 95% or less. In this case, the electron transport property in the electron transport layer 3 improves further by having a sufficient amount of electro-conductive additive 8 present within the gel layer 6. In addition, sufficiently securing a region where photoelectric conversion is possible within the gel layer 6 becomes possible by having sufficient amounts of organic compounds and electrolyte solution in the voids of the electro-conductive additive 8, further improving the conversion efficiency.

The average fiber length/average fiber diameter ratio of the fibrous electro-conductive material is preferably 1,000 or greater. The average fiber length and the average fiber diameter are the mean values of the fiber length and the fiber diameter of the electro-conductive material as measured from the results of observation by an electron microscope such as SEM (number of measurements: 30). The node portions of the fibrous electro-conductive material are excluded from the fiber diameter measurement locations. In this case, layering the fibrous electro-conductive materials in a state in which they are arranged in the direction of the plane of the first electrode 2 is facilitated, rising the porosity of the electro-conductive additive 8 formed from the fibrous electro-conductive materials, further improving the conversion efficiency.

The electro-conductive additive 8 may be present within the gel layer 6. The electro-conductive additive 8 is used for the purpose of improving the electron transport property between the electron transport layer 3 and the first electrode 2. The electro-conductive additive 8 is preferably in a state where, for instance, it is mixed within the electron transport layer 3 to be chained by being in contact with one another at the same time as a portion is in contact with the first electrode 2. In this case, the movement of electrons from the electron transport layer 3 to the first electrode 2 or from the first electrode 2 to the electron transport layer 3 becomes extremely rapid as it is carried out through the electro-conductive additive 8, allowing the electron transport property between the electron transport layer 3 and the first electrode 2 to be improved further. For instance, when the photoelectric element is a photoelectric conversion element such as a dye-sensitized photoelectric conversion element, the electro-conductive additive 8 can collect electricity efficiently from the electron transport layer 3 and transport it rapidly to the first electrode 2.

The electro-conductive additive 8 present within the gel layer 6 of the electron transport layer 3 is preferably formed from a material provided with both light-transmittance and electric conductivity. Concretely, the electro-conductive material is preferably present within the electron transport layer 3. ITO (indium-tin oxide), tin oxide, zinc oxide, silver, gold, copper, carbon nanotube, graphite and the like are desirable as such electro-conductive materials. In addition, Pastolan, manufactured by Mitsui Mining & Smelting Co., Ltd, which has barium sulfate or aluminum borate as the core and tin oxide, doped tin oxide, ITO, or the like, coated onto this core may also be cited as the electro-conductive material. In addition, metal microparticles can also be used in a range where the electron transport layer 3 does not loose light-transmittance.

The volume resistivity of the electro-conductive additive 8 is preferably $10^7$ Ω/cm or less, more preferably $10^5$ Ω/cm or less, and particularly preferably 10 Ω/cm or less. At this time, the lower limit value, while not limited in particular, is in general on the order of $10^{-9}$ Ω/cm. While not to be of particular concern, the resistivity of the electro-conductive additive 8 is preferably the same resistivity as in the first electrode 2.

Figure 4:
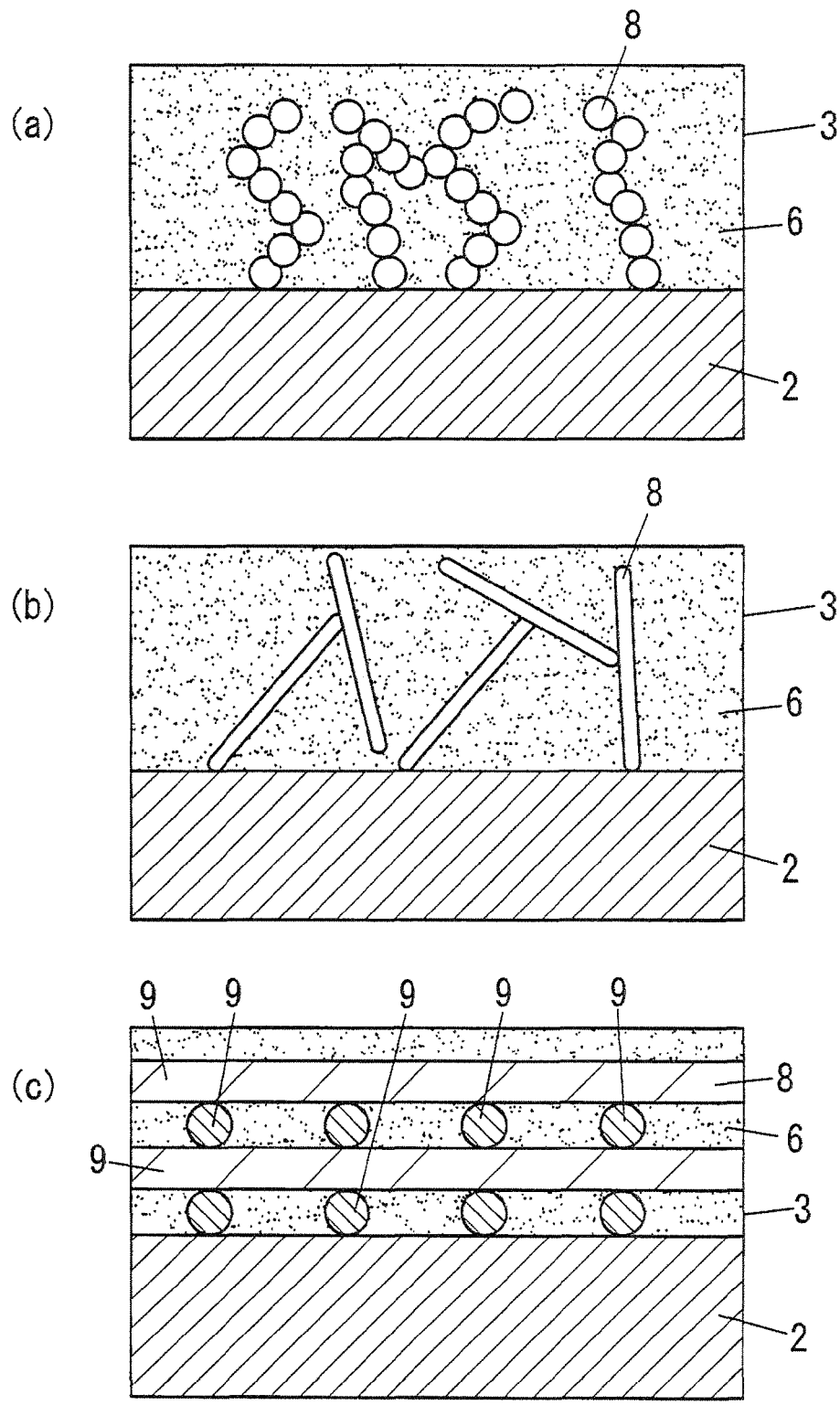
FIG. 4 is a cross-sectional overviews showing a variation example the embodiment with (a), (b) and (c) being partial enlargements.

The electro-conductive additive 8 may be formed of an aggregation of a plurality of particles of electro-conductive materials being chained while coming into contact as shown in FIG. 4(*a*), and in addition, may be formed from rod-shaped electro-conductive materials as shown in FIG. 4(*b*). When the electro-conductive additive 8 is formed of the aggregation of particles of electro-conductive materials, the average particle size of the electro-conductive material thereof is preferably 1 nm or greater but 1 μm or less. The average particle size is the mean value of the particle size of the electro-conductive material as measured from the results of observation by an electron microscope such as SEM (number of measurements: 30).

In this case, owing to the average particle size being 1 nm or greater, the electro-conductive material 3 does not become isolated in the electron transport layer 3, and in addition, owing to the average particle size being 1 μm or less, the contact surface area with the electron transport layer 3 can be rendered sufficient. Consequently, a sufficient electricity-collection effect can be obtained.

From the points of view of taking up a large contact surface area with the electron transport layer 3 and securing a contact point with the electro-conductive material 3, a rod-shape is also desirable for the electro-conductive additive 8. Here, the rod-shape designates shapes that include, not only those that are straight shapes, but also those that have, for instance, fiber-shape, needle-shape or a curved elongated shape. When the electro-conductive additive 8 is formed from a rod-shaped electro-conductive material, the average axial ratio thereof between the long axis and the short axis is preferably 5 or greater but 50 or less. If the average axial ratio is 5 or greater, a contact occurs among the electro-conductive materials 3 mixed into the electron transport layer 3 internal and mutually between the electro-conductive material 3 and the first electrode 2, allowing the electrical conduction to become extremely satisfactory, which can decrease the resistance at the interface between the electron transport layer 3 and the first electrode 2. In addition, having the average axial ratio at 50 or less can prevent the electro-conductive additive 8 from being mechanically destroyed when the electro-conductive additive 8, the organic compound, and the like, are mixed uniformly to prepare a paste.

In addition, then the electro-conductive additive 8 is formed from a rod-shaped electro-conductive material, the average external diameter of the short axis of this electro-conductive material is preferably 1 nm or greater but 20 μm or less. By having the average external diameter of the short axis of this electro-conductive material at nm or greater, the electro-conductive material is not mechanically destroyed when a paste comprising the electro-conductive material and the organic compound uniformly mixed is prepared. Therefore, when forming the electron transport layer 3 from the paste, the resistance at the interface between the electron transport layer 3 and the first electrode 2 can be reduced. In addition, by having the average external diameter of the short axis of this electro-conductive material at 20 μm or less, the decrease in organic compound per unit volume in electron transport layer 3, which accompanies the addition of the electric conductor, can be suppressed.

In addition, it is particularly desirable that the electro-conductive additive 8 is formed from fibrous electro-conductive materials this case, in order to layer the fibrous electro-conductive materials in a state in which they are arranged in the direction of the plane of the first electrode 2, by assuming a structure in which fibers that are arranged in the direction of the plane of the first electrode 2 are layered obviously within the plane of the fiber orientation, but also in the direction of the film-thickness, a high electricity-collection effect can be realized. In addition, since the electro-conductive material is fibrous, the strength of the electro-conductive additive 8 formed from this electro-conductive material becomes stronger, raising the porosity of the electro-conductive additive 8 is facilitated, and forming the electron transport layer 3 or the gel layer 6 in the voids of the electro-conductive additive 8 is facilitated.

In addition, when the electro-conductive additive 8 is formed from the fibrous electro-conductive material, the average external diameter of the short axis of the fibrous electro-conductive material is preferably 50 nm or greater but 1,000 nm or less. By having the average external diameter at 50 nm or greater, the strength of the electro-conductive additive 8 is further improved, allowing an electro-conductive additive 8 with high porosity to be formed. In addition, when providing the electro-conductive additive 8 on the first electrode 2, this facilitates forming first on the first electrode 2 only a highly strong porous electro-conductive film comprising a fibrous electro-conductive material to use this porous electro-conductive film as the electro-conductive additive 8, and then, forming the electron transport layer 3 or the gel layer 6 in the voids of this electro-conductive additive 8. In addition, by having the average external diameter at 1,000 nm or less, the porosity of the electro-conductive additive 8 formed from the fibrous electro-conductive material is increased while at the same time the specific surface area thereof is increased sufficiently, thereby allowing the output of the photoelectric element to be increased.

In addition, the porosity of the electro-conductive additive 8 formed from the fibrous electro-conductive material is preferably 50% or greater but 95% or less. Here, the porosity of the electro-conductive additive 8 formed from the fibrous electro-conductive material is the porosity of the layer comprising the electro-conductive additive 8 only (porous electro-conductive film); excluding the organic compound, the electrolyte solution, and the like, from the gel layer 6. Having the porosity at 50% or greater allows sufficient amounts of organic compound and electrolyte solution constituting the electron transport layer 3 or the gel layer 6 to be present within the porous electro-conductive film, and regions where photoelectric conversion is possible can be secured sufficiently within the gel layer 6. In addition, having the porosity at 95% or less prevents the distance from the first electrode 2 to the fibrous electro-conductive material from becoming excessively long, which can prevent the resistance-loss reducing effect from diminishing.

Figure 5:
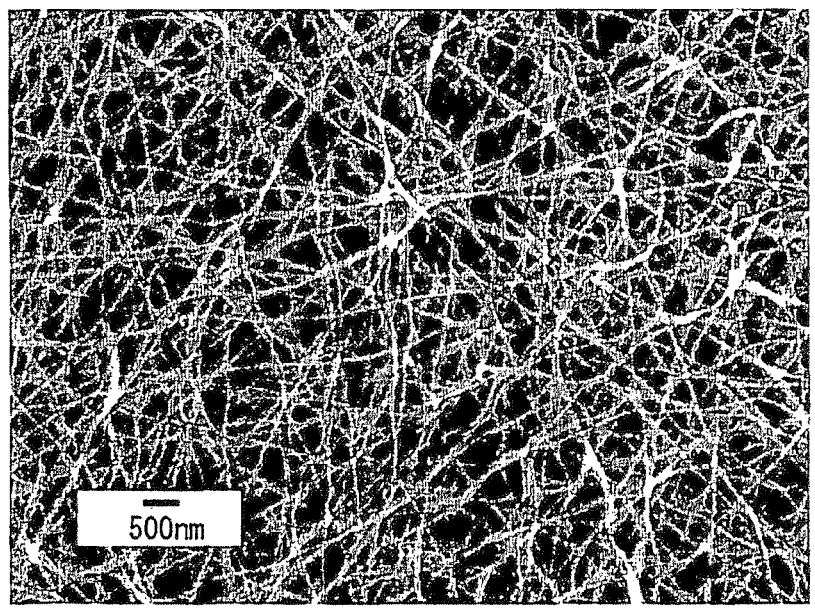
FIG. 5 is an electron micrograph of the porous electro-conductive film in Example 13.

In addition, the average fiber length/average fiber diameter ratio (average axial ratio) of the fibrous electro-conductive material is preferably 1,000 or greater. In this case, layering the fibrous electro-conductive materials in a state in which they are arranged in the direction of the plane of the first electrode 2 is facilitated. FIG. 4 (*c*) shows schematically how the fibrous electro-conductive material 9 is layered in a state in which it is arranged in the planar direction to constitute the electro-conductive additive 8, and FIG. 5 shows an electron micrograph in a planar view of the electro-conductive additive 8 constituted with the fibrous electro-conductive material 9. Therefore, the porosity of the electro-conductive additive 8 formed from fibrous electro-conductive material becomes higher, allowing a higher light-electricity interconversion efficiency to be realized.

The roughness factor of the electro-conductive additive 8 in the gel layer 6 is preferably 5 or greater but 2,000 or less.

When this roughness factor is less than 5, there is the risk that the electron movement distance within the gel layer 6 becomes long, such that the electricity-collection effect from the gel layer 6 is not sufficiently obtained. In addition, when the roughness factor of the electro-conductive additive 8 is greater than 2,000, there is the risk that the occurrence of a side reaction at the surface of the electro-conductive additive 8 becomes facilitated, which is a factor in a decrease in the conversion efficiency. Generally, if the first electrode 2 is a transparent electrode film formed from ITO, or the like, this first electrode 2 becomes a non-porous, compact film, the roughness factor thereof being, in general, a value of 1.5 or less.

For the electro-conductive additive 8 such as described above to be present within the gel layer 6, for instance, the organic compound and the electro-conductive additive 8 for forming the electron transport layer 3 are mixed to prepare a mixture such as a paste, and this mixture is formed into a coating film by similar methods to the forming of the electron transport layer 3 on the surface of the first electrode 2 already described. In addition, coating a solution comprising a pre-dispersed electro-conductive material on the surface of the first electrode 2 and drying this solution thereby forming the electro-conductive additive 8 comprising a porous electro-conductive film over the first electrode 2, and then, coating a solution containing the organic compound for forming the electron transport layer 3 over this porous electro-conductive film, is also adequate. In this case, an electro-conductive material may further be mixed in the solution containing the organic compound.

As methods for mixing the organic compound and the electro-conductive material for forming the electron transport layer 3, well known general-purpose mixing means may be adopted (for instance, wheel-form kneader, ball-form kneader, blade-form kneader, roll-form kneader, mortar, automatic mortar grinder, colloid mill, omnimixer, swing-mix, electromagnetic mixer and the like). This allows a mixed paste or slurry of the organic compound and the electro-conductive material to be obtained.

In addition, as hole transport materials for forming the hole transport layer 4, an electrolyte solution comprising electrolytes such as a redox pair dissolved in a solvent, solid electrolytes such as molten salts, p-type semiconductors such as copper iodide, amine derivatives such as triphenyl amine, electro-conductive polymers such as polyacetylene, polyaniline and polythiophene, and the like, may be cited.

When forming the hole transport layer 4 with an electrolyte solution, the hole transport layer 4 can also be formed with the electrolyte solution constituting the gel layer 6. In this case, the electrolyte solution constituting the gel layer 6 constitutes a portion of the hole transport layer 4.

In addition, when forming the hole transport layer 4 with an electrolyte solution, the electrolyte solution may assume a structure retained in the form of a polymer matrix. As polyvinylidene fluoride series macromolecular compounds used as the polymer matrix, homopolymer of vinylidene fluoride, or copolymer of vinylidene fluoride and another polymerizable monomer, preferably a radical polymerizable Monomer, may be cited. As the other polymerizable monomers copolymerizing with vinylidene fluoride (hereafter referred to as copolymerizable monomer), concretely, hexafluoropropylene, tetrafluoroethylene, trifluoroethylene, ethylene, propylene, acrylonitrile, vinylidene chloride, methyl acrylate, ethyl acrylate, methyl methacrylate, styrene and the like, can be given as examples.

The hole transport layer 4 may contain a stable radical compound. In this case, a positive hole generated by electric charge separation can be efficiently transported to the counter-electrode by the extremely rapid electron transfer reaction of the stable radical compound, which allows the photoelectric conversion efficiency of the photoelectric element to be improved.

While not to be limited in particular as long as they are compounds having a chemical species having an unpaired electron, that is to say, a radical, radical compounds having a nitroxide (NO.) within the molecule are desirable as the stable radical compounds. In addition, the molecular weight (number average molecular weight) of the stable radical compound is preferably 1,000 or greater, in which case, since the stable radical compound is solid or approaches a solid at an ordinary temperature, volatilization is unlikely to occur, allowing the stability of the element to be improved.

This stable radical compound will be described further. The stable radical compound is a compound that generates a radical compound through at least one process among an electrochemical oxidation reaction and an electrochemical reduction reaction. While the species of the stable radical compound is not limited in particular, it is preferably a radical compound that is stable. In particular, the stable radical compound is preferably an organic compound containing any one or both structural units in [Chem. 16] and [Chem. 17] below:

[Chem. 16]

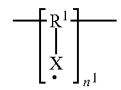

In the formula, substituent $R^1$ represents a substituted or unsubstituted C2-C30 alkylene group, C2-C30 alkenylene group, or C4-C30 arylene group, X represents an oxy radical group, a nitroxyl radical group, a sulfur radical group, a hydrazyl radical group, a carbon radical group, or a boron radical group, and $n^1$ represents an integer of 2 or greater.

[Chem. 17]

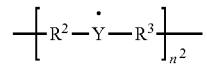

In the formula, substituents $R^2$ and $R^3$ each independently represents a substituted or unsubstituted C2-C30 alkylene group, C2-C30 alkenylene group, or C4-C30 arylene group, Y represents a nitroxyl radical group, a sulfur radical group, a hydrazyl radical, group, or a carbon radical group, and $n^2$ represents an integer of 2 or greater.

As the stable radical compounds indicated in [Chem. 16] and formula [Chem. 17], for instance, oxy radical compound, nitroxyl radical compound, carbon radical compound, nitrogen radical compound, boron radical compound, sulfur radical compound, and the like, may be cited.

As concrete examples of the oxy radical compound, for instance, the following aryloxy radical compounds indicated in [Chem. 18] to [Chem. 19], the semiquinone radical compounds indicated in [Chem. 20], and the like, may be cited.

[Chem. 18]

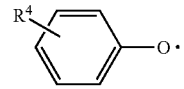

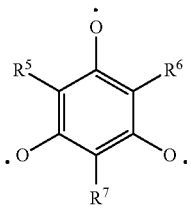

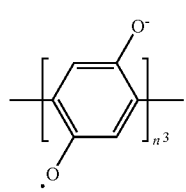

In the chemical formulae indicated by [Chem. 18] to [Chem. 20], the substituents $R^4$ to $R^7$ each independently represents a hydrogen atom, a substituted or unsubstituted aliphatic or aromatic C1-C30 hydrocarbon group, a halogen group, a hydroxyl group, a nitro group, a nitroso group, a cyano group, an alkoxy group, an aryloxy group or an acyl group. In the chemical formula [Chem. 20], $n^3$ represents an integer of 2 or greater.

In addition, as concrete examples of nitroxyl radical compound, stable radical compounds having the peridinoxy ring indicated by [Chem. 21], stable radical compounds having the pyrrolidinoxy ring indicated by [Chem. 22], stable radical compounds having the pyrrolinone ring indicated by [Chem. 23], stable radical compounds having the nitronyl nitroxide structure indicated by [Chem. 24], in the following, and the like, may be cited.

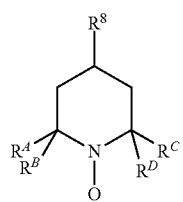

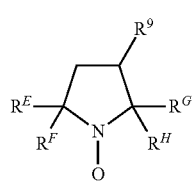

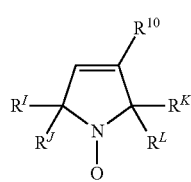

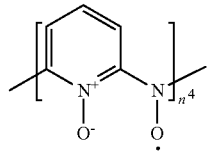

In the chemical formulae indicated by [Chem. 21] to [Chem. 23], $R^8$ to $R^{10}$ and $R^A$ to $R^L$ each independently represents a hydrogen atom, a substituted or unsubstituted aliphatic or aromatic C1-C30 hydrocarbon group, a halogen group, a hydroxyl group, a nitro group, a nitroso group, a cyano group, an alkoxy group, an aryloxy group or an acyl group. In addition, in the chemical formula indicated by [Chem. 24], $n^4$ represents an integer of 2 or greater.

In addition, as concrete examples of the nitroxyl radical compound, radical compounds having the tervalent hydrazyl group indicated by [Chem. 25], radical compounds having the tervalent verdazyl group indicated by [Chem. 26], radical compounds having the amino triazine structure indicated by [Chem. 27], in the following and the like, may be cited.

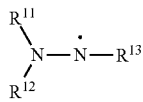

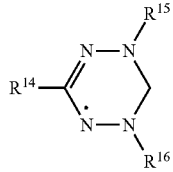

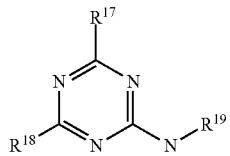

In chemical formulae [Chem. 25] to [Chem. 27], $R^{11}$ to $R^{19}$ each independently represents a hydrogen atom, substituted or unsubstituted aliphatic or aromatic C1-C30 hydrocarbon group, a halogen group, a hydroxyl group, a nitro group, a nitroso group, a cyano group, an alkoxy group, an aryloxy group or an acyl group.

Any of the organic macromolecular compounds in [Chem. 16] to [Chem. 27] above has excellent stability, and as a result, can be used stably as a photoelectric conversion element or an energy-accumulating element, allowing a photoelectric element having excellent stability, and moreover, excellent reaction speed, to be obtained readily.

In addition, using a stable radical that is in the solid state at room temperature is desirable. In this case, the contact between the radical compound and the electron transport layer 3 can be maintained stably, allowing alteration and deterioration due to side reaction or fusion with another chemical compound, or diffusion, to be suppressed. As a result, the stability of the photoelectric element can be rendered excellent.

The electric charge transport layer (hole transport layer 4) may contain the azaadamantane-N-oxyl derivative indicated in [Chem. 28]. In this case, when the electron transport layer 3 is radiated by light, an electron or a positive hole is generated from the electron transport layer 3, this electron or positive hole participates in the oxido-reduction reaction of the azaadamantane-N-oxyl derivative, the azaadamantane-N-oxyl derivative becomes a redox couple accompanying the electrochemical oxidation reaction or reduction reaction, at which time the electric current is taken outside, with the first electrode 2 serving as the negative electrode and the second electrode 5 serving as the positive electrode.

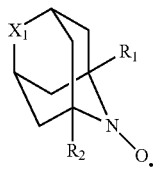

[Chem. 28]

$R_1$ and $R_2$ each independently represents hydrogen, fluorine, an alkyl group or a substituted alkyl group, and $X_1$ represents a methylene group or the N-oxyl group indicated in [Chem. 29].

[Chem. 29]

The azaadamantane-N-oxyl derivative contains a nitroxide (NO.) in the molecule, and generates a radical compound in at least one process of electrochemical oxidation reaction or reduction reaction. The generation this radical compound allows the electric charge to be transported to the counter-electrode efficiently by an extremely rapid charge-transfer reaction. Furthermore the azaadamantane-N-oxyl derivative is a highly active compound as an oxidation catalyst for alcohols, with a catalytic capability exceeding that of the 2,2,6,6-tetramethyl piperidine-1-oxyl (TEMPO) derivative. Therefore, it is anticipated that the electron donating-accepting reaction at the joining interface between the electric charge transport layer (hole transport layer 4) and the photo-sensitizer is rapid, rectification property of the generated electron provided at the electric charge separation interface, and electric charge recombination after electric charge separation is suppressed. In addition, due to the azaadamantane-N-oxyl derivative having a nitroxide, the sites that trap the electric charges become small, which allows the portion that can transport the electric charge to have high density, improving the electric charge transport properties, thereby allowing the photoelectric conversion efficiency of the element to be improved.

The azaadamantane-N-oxyl derivative is preferably one or more species selected from the azaadamantane-N-oxyl indicated in [Chem. 30] and the 1-methyl-2-azaadamantane-N-oxyl indicated in [Chem. 31]. In this case, as the electric charge transport property improves further, the photoelectric conversion efficiency of the element improves.

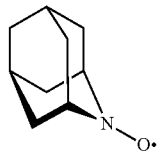

[Chem. 30]

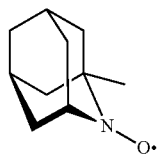

[Chem. 31]

From the point of view of light absorption and charge-transfer to the semiconductor 1, it is important to control the redox potential of the azaadamantane-N-oxyl derivative. For instance, the redox potential can be changed by having a derivative in which, with respect to the azaadamantane-N-oxyl from [Chem. 28] in which $R_1$ and $R_2$ are both hydrogens, at least one among $R_1$ and $R_2$ has been replaced by a substituted alkyl group having a substituent such as a hydroxyl group, an ether group, a carboxyl group, an ester group, a phosphonyl group or a sulfonyl group.

In addition, for instance [Chem. 32] indicates a compound from [Chem. 28] in which both $R_1$ and $R_2$ are hydrogens and $X_1$ is the N-oxyl group indicated in [Chem. 29] and by having a plurality of nitroxy radical structures present within a compound in this way, it can be anticipated that, in addition to being able to control the redox potential similarly to above, the stability of the charge-transfer is improved due to an increase in the reaction sites.

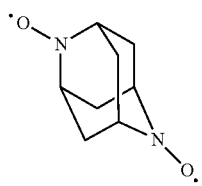

[Chem. 32]

In addition, raising the chemical stability of azaadamantane-N-oxyl derivative is also desirable, for instance, by fluorine substitution of one or both among $R_1$ and $R_2$ in [Chem. 28], as shown respectively in [Chem. 33] and [Chem. 34]. [Chem. 33] and [Chem. 34] indicate cases where $X_1$ is a methylene group.

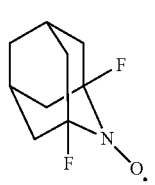

[Chem. 33]

-continued

[Chem. 34]

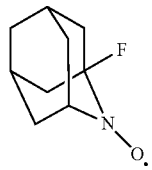

The concentration in the azaadamantane-N-oxyl derivative in the electric charge transport layer (hole transport layer 4) is preferably 1 mM to 1 M. If within this range, the azaadamantane-N-oxyl derivative can exert an electric charge transfer property that is sufficient for photoelectric conversion. If the concentration in azaadamantane-N-oxyl derivative is smaller than 1 mM, there is the risk that the photosensitized electric charge cannot be transported sufficiently to the counter-electrode.

In addition, the second electrode 5 functions as the positive electrode of the photoelectric element and can be formed similarly to the first electrode 2 described above. In order to act efficiently as a positive electrode of the photoelectric element, this second electrode 5 is preferably formed from a material having a catalytic action that provides an electron to the reductant of the electrolyte used for the electric charge transport layer (hole transport layer 4). As counter-electrode materials for forming the second electrode 5, although they depend on the species of the element to be fabricated, for instance, metals such as platinum, gold, silver, copper, aluminum, rhodium and indium, carbon materials such as graphite, carbon nanotube and platinum-supporting carbon, electro-conductive metal oxides such as indium-tin complex oxide, tin oxide doped with antimony and tin oxide doped with fluorine, electro-conductive polymers such as polyethylene dioxythiophene, polypyrrole and polyaniline, and the like, may be cited. Among these, platinum, graphite, polyethylene dioxythiophene and the like are particularly desirable.

Figure 2:
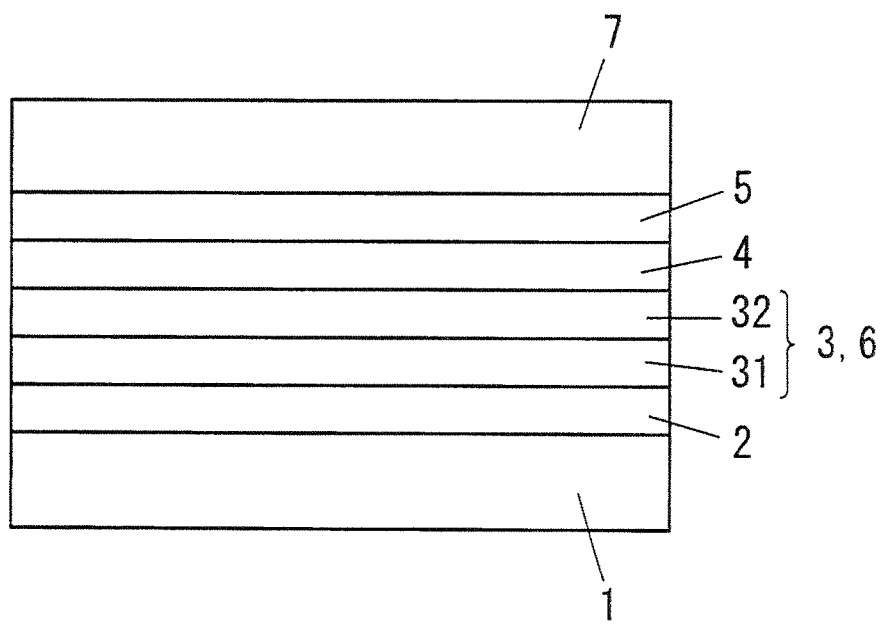
FIG. 2 is a cross-sectional overview showing a variation example of the embodiment.
Figure 3:
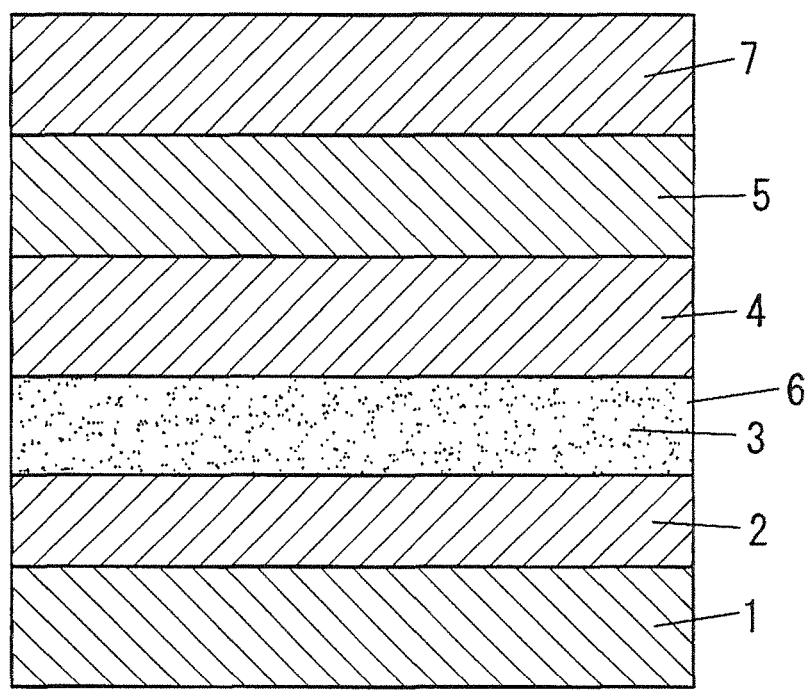
FIG. 3 is a cross-sectional overview showing a variation example of the embodiment.

The second electrode 5 may be layered and provided above the second substrate 7, as shown in FIGS. 2 and 3. The second substrate 7 is formed for instance from the same material as the first substrate 1. If the first substrate 1 has light-transmittance, the second substrate 7 may have or may not have light-transmittance. However, in order for injection of light to be possible from both the first substrate 1 and the second substrate 7, it is desirable that the second substrate 7 has light-transmittance. If the first substrate 1 does not have light-transmittance, it is desirable that the second substrate 7 has light-transmittance. If the second electrode 5 is to function as a substrate for light injection, the first substrate 1 may be formed from a material that does not transmit light.

When fabricating a photoelectric element, for instance, the organic compound is layered by a wet-type method, or the like, over the first electrode 2 provided on the first substrate 1 thereby forming the electron transport layer 3 fixedly on the first electrode 2, and the hole transport layer 4 and the second electrode 5 are layered over this electron transport layer 3. When forming the hole transport layer 4 with an electrolyte solution, the hole transport layer 4 can be formed, for instance, by filling the opening or gap between the electron transport layer 3 and the second electrode 5 with the electrolyte solution in a sealed state with a sealant between the electron transport layer 3 and the second electrode 5. At this time, a portion of the electrolyte solution penetrates into the electron transport layer 3 while the organic compound constituting the electron transport layer 3 swells, thereby forming the gel layer 6.

The photoelectric element constituted as per the above the description functions as a photoelectric conversion element. Meeting this photoelectric conversion element, light radiates from the first substrate 1 side through the first electrode 2, a sensitizing dye becomes excited by absorbing the light, generated excitation electrons flow into the electron transport layer 3 and are taken outside through the first electrode 2 at the same time as positive holes in the sensitizing dye are taken outside from the hole transport layer 4 through the second electrode 5.

The photoelectric element according to the present embodiment has high storage capability. That is to say, the open-circuit voltage maintenance rate when light is radiated on the photoelectric element and then this light to the photoelectric element is shielded, is high. If light at 200 lux has been radiated for 300 seconds onto the photoelectric element, at which time point the open-circuit voltage of the photoelectric element is A (V), and if the light radiation to the photoelectric element was shielded at the above time point and this state has been maintained for 5 minutes, at which time point the open-circuit voltage of the photoelectric element is B (V), then, the open-circuit voltage maintenance rate is represented by percentage of B with respect to A ((B/A)×100(%)). In the photoelectric element according to the present embodiment, the open-circuit voltage maintenance rate can be 10% or greater. That is to say, A and B described above can satisfy the following relational expression:

$$(B/A) \times 100 \geq 10.$$

It is assumed that this is due to the suppression of the movements to the mediators (the hole transport materials forming the hole transport layer 4), of the electrons retained in the electron transport layer 3 in the present embodiment. When a photoelectric element having such high storage ability is used as a power source, destabilization of the supply of power by the presence and absence of light radiation is suppressed.

EXAMPLES

Hereafter, the present invention will be described concretely by way of examples.

In Examples 9 to 13, the roughness factor of the electro-conductive additive 8 was determined with the surface area of the electro-conductive material determined by the nitrogen adsorption method as the real surface area of the electro-conductive additive 8 and the projected surface area of the porous electro-conductive film formed from this electro-conductive material as the projected surface area of the electro-conductive additive 8 according to the formula: (real surface area/projected surface area)×100=roughness factor.

In addition, the void volume in the porous electro-conductive film was determined by the pore distribution measurement method to determine porosity according to the formula: (void volume/apparent volume of the porous electro-conductive film)×100=porosity.

Example 1

Synthesis of Galvi Monomer

Into a reaction container, 4-bromo-2,6-di-tert-butyl phenol (135.8 g; 0.476 mol) and acetonitrile (270 ml) were introduced, furthermore, under inert atmosphere, N,O-bis (trimethylsilyl)acetamide (BSA) (106.3 g; 129.6 ml) was added, which were stirred overnight at 70° C. and reacted until crystals were deposited completely. The deposited white crystals were filtered, vacuum-dried and then re-crystallized with ethanol for purification to obtain a white plate crystal of (4-bromo-2,6-di-tert-butyl phenoxy)trimethylsilane (150.0 g; 0.420 mol) indicated by the symbol "1" in [Chem. 35].

Next, in the reaction container, under inert atmosphere, the above (4-bromo-2,6-di-tert-butyl phenoxy)trimethylsilane (9.83 g; 0.0275 mol) was dissolved in tetrahydrofuran (200 ml), and the prepared solution was cooled to −78° C. using dry ice/methanol. Added to this solution inside the reaction container was 1.58 M of n-butyl lithium/hexane solution (15.8 ml; 0.025 mol), and lithiation was carried out by stirring at a temperature of 78° C. for 30 minutes. Thereafter, a tetrahydrofuran (75 ml) solution of methyl 4-bromobenzoate (1.08 g; 0.005 mol, Mw: 215.0, TCI) was added to this solution, which was then stirred overnight at −78° C. to room temperature. This changed the solution from yellow to pale yellow, and to dark blue, which indicates the generation of anions. After the reaction, an aqueous solution saturated with ammonium chloride was added to the solution inside the reaction container until the color of the solution became completely yellow, and then, this solution was fractionated and extracted with ether/water to obtain a product in a yellow viscous liquid form.

Next, the product, THF (10 ml), methanol (7.5 ml) and a stirring bar were introduced into a reaction container, after dissolution, 10 N—HCl (1 to 2 ml) was added gradually until the solution inside the reaction container changed to red-orange, which was stirred for 30 minutes at room temperature. Next, by purification through each of the operations of solvent extraction, fractionation and extraction by ether/water, solvent extraction, fractionation by column chromatography (hexane/chloroform=1/1) and recrystallization with hexane, an orange crystal of (p-bromophenyl)hydrogalvinoxyl (2.86 g; 0.0049 mol) indicated by the symbol "2" in [Chem. 35] was obtained.

Next, inside the reaction container, the above (p-bromophenyl)hydrogaivinoxyl (2.50 g; 4.33 mmol) was dissolved under inert atmosphere in toluene (21.6 ml; 0.2 M), 2,6-di-tert-butyl-p-cresol, (4.76 mg; 0.0216 mmol), tetrakis (triphenylphosphine)palladium (0) (0.150 g; 0.130 mmol), and tri-n-butylvinyl tin (1.65 g; 5.20 mmol, Mw: 317.1, TCI) were added rapidly to this solution, which was stirred at 100° C. for 17 hours.

The reaction product obtained by this was fractionated and extracted with ether/water, solvent-extracted, then, fractionated by flash column chromatography (hexane/chloroform=⅓) and further purified by recrystallization with hexane to obtain an orange fine crystal of p-hydrogalvinoxyl styrene (1.54 g; 2.93 mmol) indicated by the symbol "3" in [Chem. 35].

(Polymerization of the Galvi Monomer)

Obtained in the synthesis of galvi monomer above, 1 g of galvi monomer (p-hydrogalvinoxyl styrene), 57.7 mg of tetraethyleneglycol diacrylate, and 15.1 mg of azobisisobutyronitrile were dissolved in 2 ml of tetrahydrofuran, then, by nitrogen-exchanging and refluxing overnight, the galvi monomer was polymerized to obtain the galvi polymer indicated by symbol "4" in [Chem. 35].

(Formation of the Electron Transport Layer)

An electro-conductive glass substrate having a thickness of 0.7 mm and a sheet resistance of 100Ω/□ was readied as a first substrate 1 provided with a first electrode 2. This electro-conductive glass substrate was formed from a glass substrate and a coating film comprising fluorine-doped $SnO_2$ layered on one side of this glass substrate, the glass substrate being the first substrate 1 and the coating film being the first electrode 2.

The above galvi polymer indicated by the symbol "4" was dissolved in chlorobenzene at a proportion of 2% by mass. This solution was spincoated at 2,000 rpm over the first electrode 2 of the electro-conductive glass substrate and dried under 60° C. and 0.01 MPa for one hour thereby forming an electron transport layer 3 having a thickness of 60 nm.

This electron transport layer 3 was immersed for one hour in a saturated acetonitrile solution of the sensitizing dye (D131) indicated by [Chem. 36].

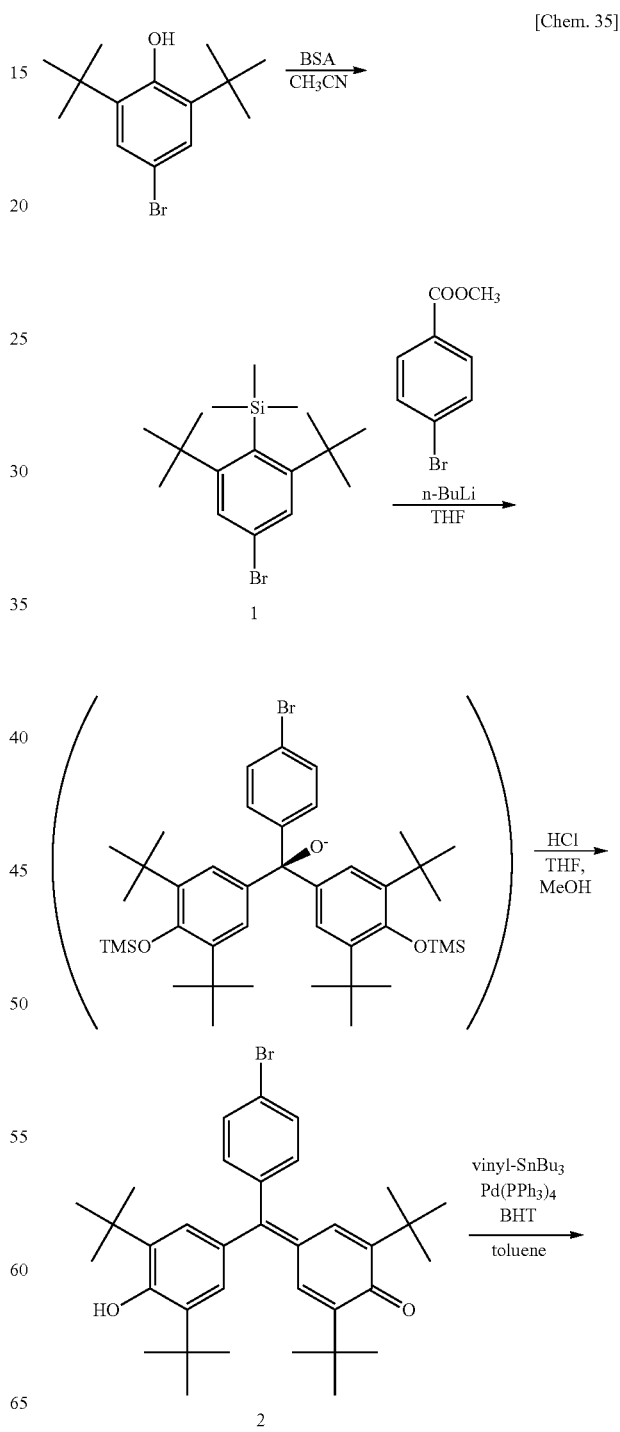

[Chem. 35]

-continued

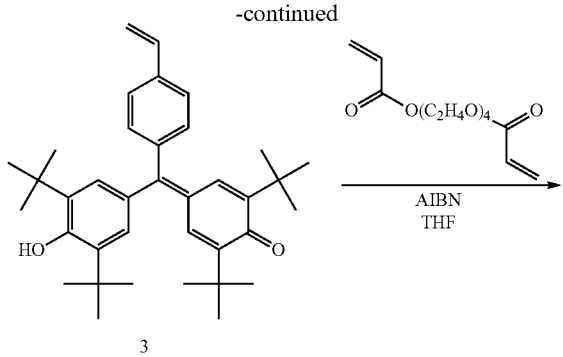

3

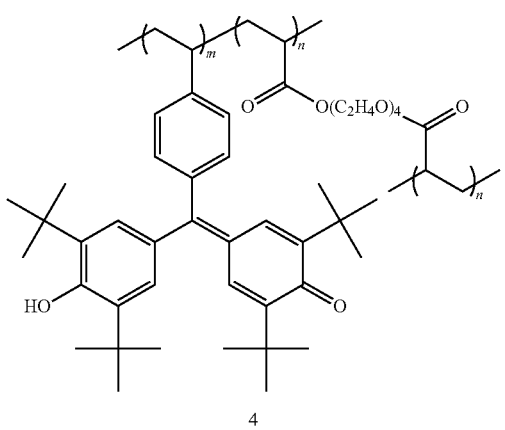

4

[Chem. 36]

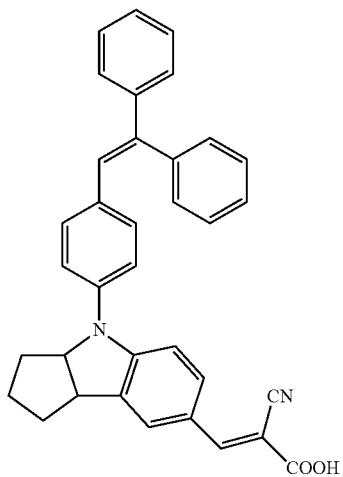

(Fabrication of Element)

An electro-conductive glass substrate having the same constitution as the electro-conductive glass substrate in the formation of the above electron transport layer 3 was readied.

In chloroplatinic acid, isopropyl alcohol was dissolved so that the concentration thereof was 5 mM, the obtained solution was spincoated over the coating film of the electro-conductive glass substrate and then fired at 400° C. for 30 minutes to form a second electrode 5.

Next, the electro-conductive glass substrate provided with the electron transport layer 3 and the electro-conductive glass substrate provided with the second electrode 5 were disposed in such a way that the electron transport layer 3 and the second electrode 5 were facing one another while at the same time, a 1 mm-wide, 50 μm-thick heat-melting adhesive ("Bynel" manufactured by Du pont-Mitsui polychemicals Co., Ltd.) was intercalated between the two parties at the outer edges. By pressing the two electro-conductive glass substrates in the thickness direction while heating this heat-melting adhesive, the two electro-conductive glass substrates were bonded through the heat-melting adhesive. A gap or opening to serve as the electrolytic solution injection port was formed in the heat-melting adhesive. Next, an electrolytic solution was filled from the injection port between the electron transport layer 3 and the second electrode 5. Next, the injection port was coated with a UV-curing resin, then, UV light was radiated to solidify the UV-curing resin, whereby the injection port was plugged. In this way, a hole transport layer 4 comprising the electrolytic solution was formed while at the same time, this electrolytic solution penetrated into the electron transport layer 3, swelling the organic compound (galvi polymer) constituting the electron transport layer 3 and forming the gel layer 6. As the electrolytic solution, an acetonitrile solution containing 2,2,6,6-tetramethyl piperidine-1-oxyl at a concentration of 1 M, the sensitizing dye (D131) at 2 mM, LiTFSI at 0.5 M and N-methyl benzimidazole at 1.6 M was used. Thus was prepared a photoelectric element.

Example 2

In Example 1, when forming the electron transport layer 3, 0.2 g of galvi polymer and 0.01 g of sensitizing dye (D131) were dissolved in 10 ml of chlorobenzene to prepare a coating solution. This solution was spincoated at 2,000 rpm over the first electrode 2 of an electro-conductive glass substrate and dried under 60° C. and 0.01 MPa for one hour thereby forming an electron transport layer 3 having a thickness of 60 nm. Immersion of this electron transport layer 3 into a saturated acetonitrile solution of sensitizing dye was not carried out.

A photoelectric element was prepared in a similar manner to Example 1 except for this.

Example 3

In Example 1, after the electron transport layer 3 was formed, this electron transport layer 3 was immersed in an aqueous solution of tetrabutyl ammonium at a concentration of 0.1 M for 15 minutes thereby anionizing the galvi polymer constituting the electron transport layer 3. This electron transport layer 3 was washed with water and then immersed in an aqueous solution of polydecylviologen (ph 10) at a concentration of 0.1 M for 15 minutes thereby bonding the polydecylviologen electrostatically to the anionized galvi polymer. Next, this electron transport layer 3 was immersed in an acetonitrile solution containing the sensitizing dye (D131) at a concentration of 0.3 mM for one hour and then washed with water. In this way, the sensitizing dye was electrostatically bonded to the portion derived from polydecylviologen, which is a substance that is positively charged in the electron transport layer 3.

In addition, as the electrolytic solution, an acetonitrile solution containing 2,2,6,6-tetramethyl piperidine-1-oxyl at a concentration of 1 M, LiTFSI at 0.5 M and N-methyl benzimidazole at 1.6 M was used.

Otherwise, a photoelectric element was prepared in a similar manner to Example 1.

Example 4

The galvi polymer indicated by symbol "4" in [Chem. 35] was obtained similarly to Example 1 by the procedure of the reaction indicated in [Chem. 35].

An electro-conductive glass substrate having a thickness of 0.7 mm and a sheet resistance of 100Ω/□ was readied as the first substrate 1 provided with the first electrode 2. This electro-conductive glass substrate was formed from a glass substrate and a coating film comprising fluorine-doped $SnO_2$ layered on one of the sides of this glass substrate, the glass substrate being the first substrate 1 and the coating film being the first electrode 2.

The galvi polymer obtained by polymerizing as described above was dissolved in chlorobenzene at a proportion of 2% by mass, this galvi polymer solution was spincoated at 2,000 rpm over the first electrode 2 of the electro-conductive glass substrate and dried under 60° C. and 0.01 MPa for one hour thereby forming a layer 31 having a thickness of 60 nm.

After the layer 31 of galvi polymer was formed in this way, this layer 31 was immersed in an aqueous solution of tetrabutyl ammonium at a concentration of 0.1 M for 15 minutes thereby anion zing the galvi polymer constituting the layer 31. This layer 31 of galvi polymer was washed with water, then, this layer 31 was immersed in an aqueous solution of polydecylviologen (pH 10) at a concentration of 0.1 M for 15 minutes thereby bonding the polydecylviologen electrostatically to the anionized galvi polymer, forming a layer 32. In this way, an electron transport layer 3 comprising the layer 31 of galvi polymer and the layer 32 of polydecylviologen was formed. When the redox potential was measured for each of the layers 31 and 32 of this electron transport layer 3 by the method indicated below, the redox potential of the layer 31 was 0 V and the redox potential of the layer 32 was –0.4 V, such that the redox potential of the electron transport layer 3 sloped from noble to base in the direction toward the first electrode 2.

Otherwise, a photoelectric element having such a layer constitution as FIG. 2 was prepared in a similar manner to Example 1.

Example 5

Synthesis of Quinone Polymer

As quinone polymer, the already-described poly(1-methacrylamide anthraquinone) of [Chem. 6] was synthesized by the reaction indicated in [Chem. 37].

[Chem. 37]

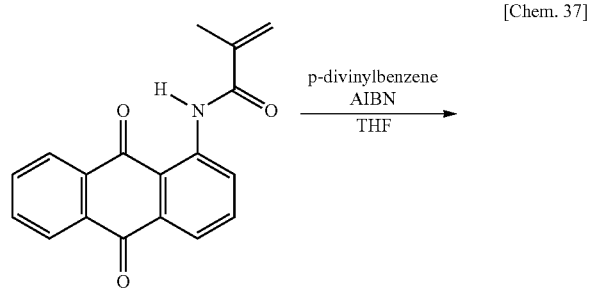

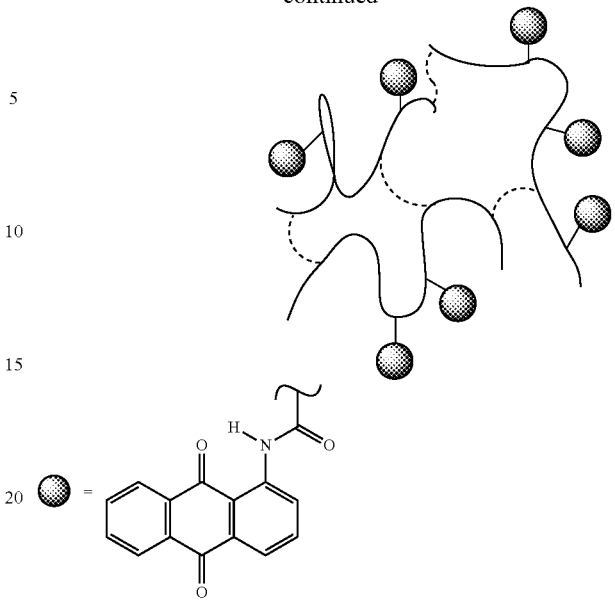

First, under argon atmosphere, a 10 ml recovery flask was loaded with 50 mg of 1-methacrylamide anthraquinone (0.172 mmol, 1 eq), 25 µl of divinylbenzene (0.172 mmol, 1 eq), 0.48 g of AIBN (azobisisobutylonitrile) (3.43 µmol, 0.02 eq), these were dissolved in 1.72 ml of THF, then, oxygen dissolved in the solvent was extracted with argon. Next, this solution was degassed and then reacted at 70° C. for 48 hours. After the end of the reaction, a precipitate was generated in the solution using methanol, further Soxhlet-washed with THF, to obtain a 37.3 mg of polymer in a yellow solid state.

(Formation of Electron Transport Layer)

In a similar manner to Example 3, a layer 31 of galvi polymer was formed over the first electrode 2 of an electro-conductive glass substrate. Next, a solution comprising 10 mg of the above polymer dissolved in 0.1 g N methyl pyrrolidone was spincoated at 1,000 rpm over the layer 31 of galvi polymer to form a 100 nm-thick layer 32 of quinone polymer, forming an electron transport layer 3 comprising the layer 31 of galvi polymer and the layer 32 of quinone polymer. When the redox potential was measured for each of the layers 31 and 32 of this electron transport layer 3 by the method indicated below, the redox potential the layer 31 was 0 V and the redox potential of the layer 32 was –0.8 V, such that the redox potential of the electron transport layer 3 sloped from noble to base in the direction toward the first electrode 2.

Next, this electron transport layer 3 was immersed in an acetonitrile solution containing the already-described sensitizing dye (D131) of [Chem. 36] at a concentration of 0.3 mM for one hour, then washed with water to provide the electron transport layer 3 with the sensitizing dye.

An electron transport layer 3 was formed in this way, and a photoelectric element having such a layer constitution as FIG. 2 was prepared in a similar manner to Example 4 for the remainder.

Example 6

Synthesis of Polyimide

Under argon atmosphere, added to a 30 ml recovery flask were 310.20 mg (0.001 mol) of 4-4'-oxydiphthalic anhydride, 2 ml of N—N-dimethyl acetamide and 108.15 mg (0.001 mol) of 1,4-phenylene diamine, which were reacted under room temperature for 18 hours. After the end of the reaction, purified by precipitation in acetone, 411.8 mg of polymer indicated in [Chem. 38] was obtained as a white solid.

[Chem. 38]

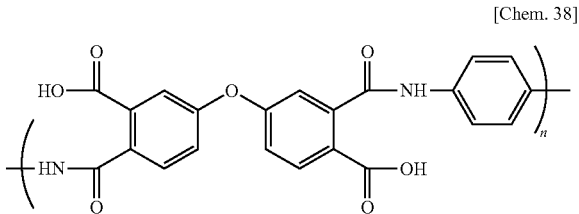

(Formation of Electron Transport Layer)

In a similar manner to Example 4, a layer 31 of galvi polymer was formed over the first electrode 2 of an electro-conductive glass substrate. Next, a solution in which 5.47 mg of the above polymer and 0.1 g of N-methyl pyrrolidone were mixed was prepared, and this solution was spincoated at 1,000 rpm on the surface of the layer 31 of galvi polymer to form a film, which thickness was 100 nm. This was heated stepwise at 150° C., 180° C., 200° C. and 220° C. for 20 minutes each, and at 250° C. for 30 minutes, to be imidized as indicated in [Chem. 39] and form a layer 32 of polyimide, forming an electron transport layer 3 comprising the layer 31 of galvi polymer and the layer 32 of polyimide. When the redox potential was measured for each of the layers 31 and 32 of this electron transport layer 3 by the method indicated below, the redox potential of the layer 31 was 0 V and the redox potential of the layer 32 was −1.0 V, such that the redox potential of the electron transport layer 3 sloped from noble to base in the direction toward the first electrode 2.

[Chem. 39]

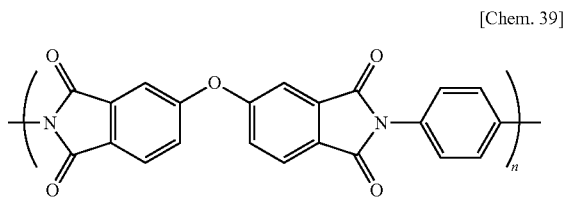

Next, this electron transport layer 3 was immersed in an acetonitrile solution containing the already-described sensitizing dye (D131) of [Chem. 36] at a concentration of 0.3 mM for one hour and then washed with water to provide the electron transport layer 3 with the sensitizing dye.

An electron transport layer 3 was formed in this way, and a photoelectric element having such a layer constitution as FIG. 2 was prepared in a similar manner to Example 4 for the remainder.

Example 7

The galvi polymer indicated by symbol "4" in [Chem. 35] was obtained similarly to Example 1 by the procedure of the reaction indicated in [Chem. 35].

A first substrate 1 made of 1 mm-thick glass on the surface of which the first electrode 2 was formed with a transparent electro-conductive oxide of fluorine-doped $SnO_2$ (manufactured by Asahi Glass Co., Ltd., 10Ω/□) was used.

Synthesized as described above, 22.5 mg of galvi compound (galvi polymer) was dissolved in 4.5 ml of chloroform, which was drop-cast on the surface of the first electrode 2 to be formed into a film having a film-thickness of 100 nm.

Next, the first electrode 2 was electrified to apply a voltage of 1.5 V or lower, whereby the galvi compound was electro-lytically oxidized and derived into a radical, forming a semiconductor by means of the galvinoxy radical polymer (the electron transport layer 3) on the surface of the first electrode 2.

That which was formed by layering the semiconductor (the electron transport layer 3) on the first electrode 2 in this way was used as the working electrode, a platinum-wire electrode as the counter-electrode, a silver/silver chloride electrode as the reference electrode, and lithium perchlorate as the support electrolyte solution, which were set on an electrochemical measurement bath. Then, when measurements were carried out by cyclic voltammetry, a stable and reversible oxido-reduction wave derived from the galvinoxy radical at 0 V with respect to the reference electrode was measured, confirming the operation as an n-type semiconductor. In addition, the amount of electrons in the electrode reaction of the reduction process agreed approximately with the theoretical reaction amount calculated from the number of radical sites (calculated from the amount of coating), such that a quantitative reaction of the coated galvinoxy radical was observed. In addition, even when the voltage was applied repeatedly (40 cycles) the oxido-reduction wave was observed stably, such that a stable operation was confirmed.

Next, the semiconductor (the electron transport layer 3) formed in this way was modified to carry a photosensitizer 5 by spincoating a saturated acetonitrile solution of the 0131 dye.

Then, the semiconductor (the electron transport layer 3) was scraped over the periphery of the first electrode 2, and a sealant comprising a heat-melting adhesive ("Bynel" manufactured by Du pont-Mitsui polychemicals Co., Ltd.) was disposed over the first electrode 2 so as to surround the semiconductor (the electron transport layer 3). Next, the second electrode 5 comprising Pt was bonded opposite to the first electrode 2 having a hole near the center opened with a diamond drill. An electrolyte solution prepared by dissolving respectively 5 mol/l of D131 dye, 0.1 mol/l of azaadaman-tane-N-oxyl, 1.6 mol/l of N-methyl benzimidazole, and 1 mol/l lithium perchlorate in acetonitrile was injected from the hole, and the hole was sealed with a UV-curing resin to obtain a photoelectric element.

Example 8

In Example 7, instead of azaadamantane-N-oxyl, 2,2,6,6-tetramethyl piperidine-1-oxyl (TEMPO) was used to prepare a photoelectric element.

Example 9

The galvi polymer indicated by symbol "4" in [Chem. 35] was obtained similarly to Example 1 by the procedure of the reaction indicated in [Chem. 35].

An electro-conductive glass substrate having a thickness of 0.7 mm and a sheet resistance of 100Ω/□ was readied as the first substrate 1 provided with the first electrode 2. This electro-conductive glass substrate was formed from a glass substrate and a coating film comprising fluorine-doped $SnO_2$ layered on one side of this glass substrate, the glass substrate being the first substrate 1 and the coating film being the first electrode 2. The roughness factor of the coating film was 1.5.

Dissolved and dispersed into chlorobenzene were 2% by mass of galvi polymer (symbol "4" in [Chem. 35]) and 1% by mass of ITO particles (20 nmφ)). This solution was spincoated at 1,000 rpm over the first electrode 2 of the electro-conductive glass substrate and dried under 60° C. and 0.01 MPa for one hour thereby forming simultaneously an electro-conductive additive 8 and an electron transport layer 3 comprising connected bodies of ITO particles. The thickness of this electro-conductive additive 8 and electron transport layer 3 was 120 nm. The roughness factor of the electro-conductive additive 8 was 110 and the porosity was 40%.

This electron transport layer 3 was immersed for one hour in a saturated acetonitrile solution of the sensitizing dye (D131) indicated by [Chem. 36].

A photoelectric element was prepared in a similar manner to Example 1 for the conditions other than this.

Example 10

In Example 9, when preparing the electro-conductive additive 8 and the electron transport layer 3, instead of the ITO particles, a solution comprising a rod-shaped (fibrous) electro-conductive material (manufactured by Mitsui Mining & Smelting Co., Ltd, TYPE-V; average axial ratio: 8.0; average short axis diameter: 1 μm) dispersed at a concentration of approximately 5% by mass was prepared and used. Otherwise, a photoelectric element was prepared in a similar manner to Example 9. In the above, the roughness factor of the electro-conductive additive 8 comprising the rod-shaped (fibrous) electro-conductive material was 150 and the porosity was 60%.

Example 11

When forming the electron transport layer 3, first, into a terpineol solution containing 20% by mass of ethyl cellulose, tin oxide (average particle size: 20 nm) was dispersed so that the concentration thereof was 20% by mass to prepare a tin oxide paste. This tin oxide paste was coated onto an electro-conductive glass substrate having the same constitution as Example 9 and fired at 450° C. for 30 minutes to prepare an electro-conductive additive 8 comprising a 3 μm-thick porous electro-conductive film. The roughness factor of this electro-conductive additive 8 was 500 and the porosity was 40%.

Next, a solution comprising the galvi polymer indicated in Example 9 (symbol "4" in [Chem. 35]) dissolved in chlorobenzene so that the concentration thereof was 2% by mass was prepared. This solution was spincoated at 500 rpm on the porous electro-conductive film and dried under 60° C. and 0.01 MPa for one hour to form an electron transport layer 3. This electron transport layer 3 was immersed in a saturated acetonitrile solution of the sensitizing dye (D131) indicated by [Chem. 36] for one hour.

Otherwise, a photoelectric element was prepared in a similar manner to Example 9.

Example 12

By a similar technique to the case of Example 11 when forming the electro-conductive additive 8, an electro-conductive additive 8 comprising a 10 μm-thick porous electro-conductive film. The roughness factor of this electro-conductive additive 8 was 2,000 and the porosity was 40%.

Next, using a solution comprising 2% by mass of galvi polymer (symbol "4" in [Chem. 35]) dissolved in chlorobenzene, electron transport layer 3 was formed by a similar technique to the case of Example 11.

Otherwise, a photoelectric element was prepared in a similar manner to Example 11.

Example 13

When forming the electron transport layer 3, first, a dimethyl formamide solution of polyvinyl acetate (molecular weight: 500,000) at a concentration of 14% by mass was prepared, which was designated the A solution. In addition, 13.5 g of tin chloride hydrate was dissolved in 100 ml of ethanol and refluxed for 3 hours to be turned into a tin oxide solution, which was designated the B solution. Then, the A solution and the B solution were mixed at a mass ratio of 0.8:1 and stirred for 6 hours, and the obtained solution was designated the C solution. This C solution was coated over a transparent electrode of an electro-conductive glass substrate by the electro-spinning method and fired at 450° C. for 30 minutes. In this way, an electro-conductive additive 8 comprising a μm-thick porous electro-conductive film formed from fibrous electro-conductive material with an average external diameter (short axis diameter) of 100 nm. A electron micrograph in a planar view of this porous electro-conductive film is shown in FIG. 5. The roughness factor of this electro-conductive additive 8 was 200 and the porosity was 80%.

Next, a solution comprising 2% by mass of the galvi polymer in Example 9 (symbol "4" in [Chem. 35]) dissolved in chlorobenzene was prepared. This solution was spincoated at 500 rpm on the porous electro-conductive film and dried under 60° C. and 0.01 MPa for one hour to form an electron transport layer 3.

This electron transport layer 3 was immersed in a saturated acetonitrile solution of the sensitizing dye (D131) indicated by [Chem. 36] for one hour.

Otherwise, a photoelectric element was prepared in a Similar manner to Example 9.

Comparative Example 1

In Example 1, after the electron transport layer 3 was formed, saturated acetonitrile solution of the sensitizing dye (D131) was spincoated on the surface of this electron transport layer 3 spincoat to attach the sensitizing dye onto the electron transport layer 3. Immersion of this electron transport layer 3 into the saturated acetonitrile solution of sensitizing dye was not carried out.

In addition, as the electrolytic solution, an acetonitrile solution containing 2,2,6,6-tetramethyl piperidine-1-oxyl at a concentration of 1 M, LiTFSI at 0.5 M and N-methyl benzimidazole at 1.6 M was used.

Otherwise, a photoelectric element was prepared in a similar manner to Example 1.

[Storage Property]

The storage properties of the photoelectric elements obtained in Example 1 and Comparative Example 1 were evaluated.

First, each photoelectric element was irradiated with light at 200 lux for 300 seconds (5 minutes) and the open-circuit voltage of the photoelectric element was measured using Keithley 2400 source meter (manufactured by Keithley, Model 2400 general-purpose source meter). Next, each photoelectric element was placed inside a light-shielding container for 300 seconds (5 minutes) to measure the open-circuit voltage of the photoelectric element similarly to the above method.

Figure 6:
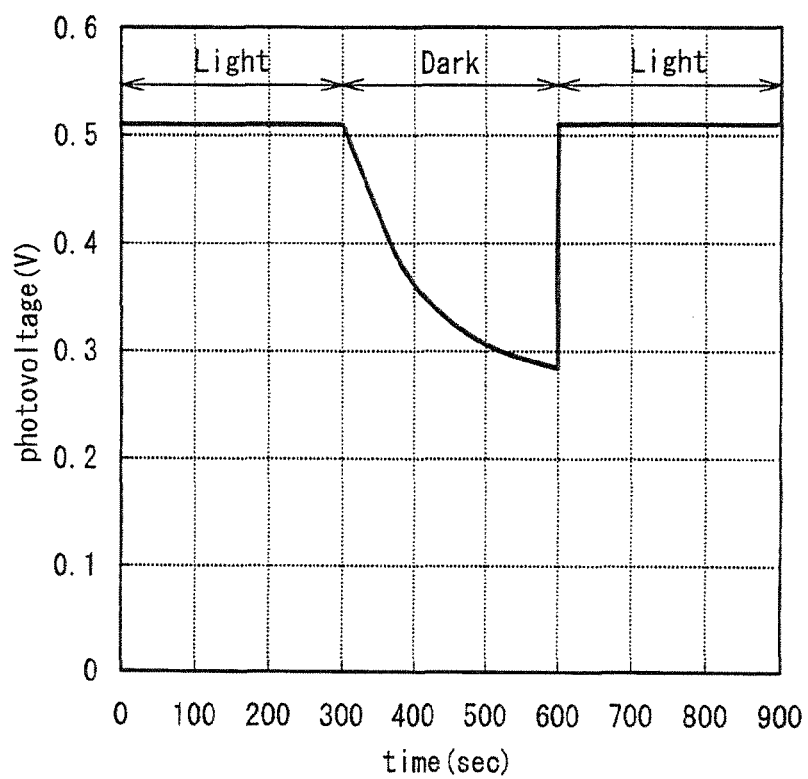
FIG. 6 is a graph showing the change over time of the open-circuit voltage for a photoelectric element when light is radiated onto a photoelectric element obtained in Example 1, and then shielded.
Figure 7:
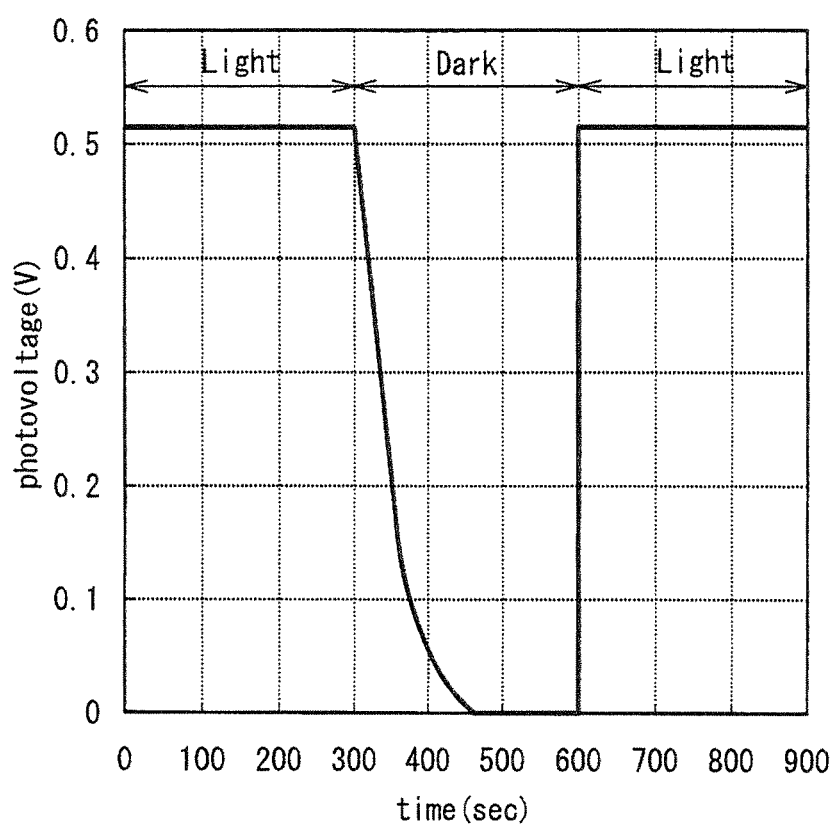
FIG. 7 is a graph showing the change over time of open-circuit voltage for a photoelectric element when light is radiated onto a photoelectric element obtained in Comparative Example 1, and then shielded.

The measurement results of the open-circuit voltage for Example 1 are shown in FIG. 6, and the measurement results of the open-circuit voltage for Comparative Example 1 are shown in FIG. 7, respectively.

According to this result, open-circuit voltage maintenance rate was 50% or greater for Example 1, a high storage ability. In contrast, the open-circuit voltage maintenance rate was less than 1% for Comparative Example 1.

[Redox Potential Measurements]

Methods for measuring the redox potentials for the layers of gaivi polymer of Examples 1 and 4 to 6, the layer of polydecylviologen of Example 4, the layer of quinone polymer of Example 5, the layer of polyimide of Example 6 are shown in the following.

(Redox Potential Measurement for Galvi Polymer Layer)

Over a glass substrate with a transparent electro-conductive film, a 100 nm-thick layer of galvi polymer was formed by spincoating similarly to Example 4. Next, the first electrode 2 provided with the galvi polymer layer was impregnated with an electrolytic solution to soak the electrolytic solution into the voids within the galvi polymer layer. An acetonitrile solution of perchloric acid tetrabutylammonium perchlorate at 0.1 mol/l was used as the electrolytic solution. Then, when a platinum electrode as the counter-electrode and Ag/AgCl electrode for the reference electrode were used to prepare a half-cell to perform an evaluation of the electric potential, the redox potential was 0 V.

(Redox Potential Measurement for Polydecylviologen Layer)

A glass substrate with a transparent electro-conductive film was immersed for 15 minutes in an aqueous solution of polydecylviologen at a concentration of 0.1 N (pH10) to form a polydecylviologen layer over the transparent electro-conductive film. Next, the first electrode 2 provided with the polydecylviologen layer was impregnated with an electrolytic solution to soak the electrolytic solution into the voids within polydecylviologen layer. An acetonitrile solution of perchloric acid tetrabutylammonium perchlorate at 0.1 mol/l was used as the electrolytic solution. Then, when a platinum electrode as the counter-electrode and Ag/AgCl electrode for the reference electrode were used to prepare a half-cell to perform an evaluation of the electric potential, the redox potential of the polydecylviologen layer was −0.4 V.

(Redox Potential Measurement for Layer of Quinone Polymer)

Over a glass substrate with a transparent electro-conductive film, a 100 nm-thick layer of quinone polymer was formed by spincoating similarly to Example 5. Next, the first electrode 2 provided with the quinone polymer layer was impregnated with an electrolytic solution to soak the electrolytic solution into the voids within the quinone polymer layer. An acetonitrile solution of perchloric acid tetrabutylammonium perchlorate at 0.1 mol/l was used as the electrolytic solution. Then, when a platinum electrode as the counter-electrode and Ag/AgCl electrode for the reference electrode were used to prepare a half-cell to perform an evaluation of the electric potential, the redox potential of the quinone polymer layer was −0.8 V.

(Redox Potential Measurement for Layer of Polyimide)

Over a glass substrate with a transparent electro-conductive film, a 100 nm-thick layer of polyimide layer r was formed by spincoating similarly to Example 6: Next, the first electrode 2 provided with the polyimide layer was impregnated with an electrolytic solution to soak the electrolytic solution into the voids within the polyimide layer. An acetonitrile solution of perchloric acid tetrabutylammonium perchlorate at 0.1 mol/l was used as the electrolytic solution. Then, when a platinum electrode as the counter-electrode and Ag/AgCl electrode for the reference electrode were used to prepare a half-cell to perform an evaluation of the electric potential, the redox potential of the polyimide layer was −1.0 V.

[Evaluation Test]

While irradiating a region of 1 $cm^2$ surface area in planar view of the photoelectric element obtained in each Example and Comparative Example with a light at 200 lux, the open-circuit, voltage and the short-circuit current value of each photoelectric element were measured by IV measurement using Keithley 2400 source meter (Model 2400 general-purpose source meter manufactured by Keithley). A fluorescent lamp (rapid fluorescence lamp, FLR20S·W/M, manufactured by Panasonic) was used as the light source, to carry out measurements under environment an of 25° C. In addition, the evaluation of the photoelectric element was carried out under conditions where of 1 $cm^2$ photoelectric converting portion received light. The results are shown Table 1 below.

TABLE 1

| | Electrifying material | | | | | Open-circuit voltage (mV) | Short-circuit voltage (μA/$cm^2$) | Maximum output (μW/$cm^2$) |
|---|---|---|---|---|---|---|---|---|
| | Species | Forming method | Thickness | Roughness factor | Porosity | | | |
| Example 1 | — | — | — | — | — | 510 | 1.0 | |
| Example 2 | — | — | — | — | — | 520 | 1.2 | |
| Example 3 | — | — | — | — | — | 530 | 1.5 | |
| Example 4 | — | — | — | — | — | 530 | 1.5 | |
| Example 5 | — | — | — | — | — | 600 | 1.3 | |
| Example 6 | — | — | — | — | — | 590 | 1.4 | |
| Example 7 | — | — | — | — | — | 605 | 0.52 | 0.23 |
| Example 8 | — | — | — | — | — | 550 | 0.5 | 0.17 |
| Example 1 | Aggregation of ITO particles | Formed at the same time as electron transport layer | 120 nm | 110 | 40% | 530 | 2.5 | — |
| Example 2 | Rod-shaped electro-conductive material | Formed at the same time as electron transport layer | 120 nm | 150 | 60% | 540 | 2.0 | — |
| Example 3 | Aggregation of $SnO_2$ particles | Formation of porous electro-conductive film (spincoat method) | 3 μm | 500 | 40% | 550 | 3.0 | — |

TABLE 1-continued

| | Electrifying material | | | | Open-circuit voltage (mV) | Short-circuit voltage ($\mu A/cm^2$) | Maximum output ($\mu W/cm^2$) |
|---|---|---|---|---|---|---|---|
| | Species | Forming method | Thickness | Roughness factor | Porosity | | | |
| Example 4 | Aggregation of $SnO_2$ particles | Formation of porous electro-conductive film (spincoat method) | 10 μm | 2000 | 40% | 550 | 1.9 | — |
| Example 5 | $SnO_2$ fiber | Formation of porous electro-conductive film (electro-spinning method) | 1 μm | 200 | 80% | 550 | 3.3 | — |
| Comparative Example 1 | — | — | — | — | — | 500 | 0.5 | — |

As can be seen in Table 1, for each of the examples, the open-circuit voltage value and the short circuit current value were higher than those for the comparative examples, confirming that the conversion efficiency was improved. Example 7, which contains an azaadamantane-N-oxyl derivative within the hole transport layer 4 was found to obtain high photoelectric conversion efficiency compared to Example 8. Examples 9 to 13, which have the electro-conductive additive 8 present within the gel layer 6, were found to obtain high photoelectric conversion efficiency.

EXPLANATION OF REFERENCE NUMERALS 1 first substrate
2 first electrode
3 electron transport layer
4 hole transport layer
5 second electrode
6 gel layer
7 second substrate

The invention claimed is:

1. A photoelectric element comprising:
a pair of electrodes; and
an electron transport layer and a hole transport layer that are sandwiched between these electrodes,
said electron transport layer comprising an organic compound having a redox moiety capable of being oxidized and reduced repeatedly,
said organic compound being combined with an electrolyte solution that stabilizes the reduced state of said redox moiety to form a gel layer, and said gel layer containing a sensitizing dye.

2. The photoelectric element according to claim 1, wherein the sensitizing dye is immobilized within the gel layer by a physical or a chemical action with the organic compound contained within said gel layer.

3. The photoelectric element according to claim 1, wherein the open-circuit voltage A (V) at the time point when light at 200 lux is radiated for 5 minutes and the open-circuit voltage B (V) at the time point when 5 minutes have elapsed from when the light is shielded at the above time point, satisfy the following relational expression:

$(B/A) \times 100 \geq 10$.

4. The photoelectric element according to claim 1, wherein a redox potential of the electron transport layer slopes from noble to base in the direction toward the electrode in contact with this electron transport.

5. The photoelectric element according to claim 4, wherein the electron transport layer contains two or more species of said organic compounds selected from the group consisting of imide derivatives, quinone derivatives, viologen derivatives and phenoxyl derivatives.

6. The photoelectric element according to claim 1, wherein the hole transport layer contains an azaadamantane-N-oxyl derivative indicated in [Chem. 1] below:

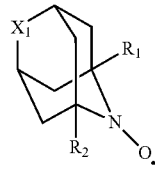

[Chem. 1]

($R_1$ and $R_2$ each independently represents a hydrogen, a fluorine, an alkyl group or a substituted alkyl group, and $X_1$ represents a methylene group or an N-oxyl group indicated in [Chem. 2])

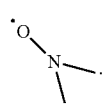

[Chem. 2]

7. The photoelectric element according to claim 6, wherein the azaadamantane-N-oxyl derivative contains at least one species selected from the group consisting of azaadamantane-N-oxyl and 1-methyl-2-azaadamantane-N-oxyl.

8. The photoelectric element according to claim 1, wherein
the photoelectric element comprises a first electrode and a second electrode as the pair of electrodes,
the electron transport layer is on the first electrode,
the hole transport layer and the second electrode are layered over this electron transport layer, and
said gel layer contains an electro-conductive additive at least a portion of which is in contact with the first electrode.

9. The photoelectric element according to claim 8, wherein a roughness factor of the electro-conductive additive is 5 or greater but 2,000 or less.

10. The photoelectric element according to claim 8, wherein the electro-conductive additive is formed of an aggregation of particles of electro-conductive materials.

11. The photoelectric element according to claim 8, wherein the electro-conductive additive is formed of a fibrous electro-conductive material.

12. The photoelectric element according to claim 11, wherein an average external diameter of the fibrous electro-conductive material is 50 nm or greater but 1,000 nm or less.

13. The photoelectric element according to claim 11, wherein a porosity of the electro-conductive additive formed of the fibrous electro-conductive material is 50% or greater but 95% or less.

14. The photoelectric element according to claim 11, wherein an average fiber length/average fiber diameter ratio of the fibrous electro-conductive material is 1,000 or greater.

15. The photoelectric element according to claim 2, wherein the open-circuit voltage A (V) at the time point when light at 200 lux is radiated for 5 minutes and the open-circuit voltage B (V) at the time point when 5 minutes have elapsed from when the light is shielded at the above time point, satisfy the following relational expression:

$$(B/A) \times 100 \geq 10.$$

* * * * *